US009559809B2

(12) United States Patent
Visoz et al.

(10) Patent No.: US 9,559,809 B2
(45) Date of Patent: Jan. 31, 2017

(54) METHOD AND DEVICE FOR PREDICTING THE PERFORMANCE OF A SYSTEM FOR COMMUNICATION OVER A TRANSMISSION CHANNEL

(71) Applicant: ORANGE, Paris (FR)

(72) Inventors: Raphaël Visoz, Vanves (FR); Antoine Berthet, Chatenay Malabry (FR); Baozhu Ning, Cachan (FR)

(73) Assignee: Orange, Paris (FR)

( * ) Notice: Subject to any disclaimer, the term of this patent is extended or adjusted under 35 U.S.C. 154(b) by 0 days.

(21) Appl. No.: 14/766,102

(22) PCT Filed: Feb. 11, 2014

(86) PCT No.: PCT/FR2014/050264
§ 371 (c)(1),
(2) Date: Aug. 5, 2015

(87) PCT Pub. No.: WO2014/125207
PCT Pub. Date: Aug. 21, 2014

(65) Prior Publication Data
US 2015/0372785 A1    Dec. 24, 2015

(30) Foreign Application Priority Data
Feb. 13, 2013  (FR) ..................... 13 51212

(51) Int. Cl.
*H04L 1/00*       (2006.01)
*H04L 1/06*       (2006.01)
(Continued)

(52) U.S. Cl.
CPC ............ *H04L 1/005* (2013.01); *H04L 1/0048* (2013.01); *H04L 1/0071* (2013.01); *H04L 1/06* (2013.01);
(Continued)

(58) Field of Classification Search
CPC ...... H04L 1/005; H04L 25/067; H04L 1/0071; H04L 1/0048; H04L 1/06; H04L 25/03891; H04L 2025/03426; H03M 13/2957
See application file for complete search history.

(56) References Cited

U.S. PATENT DOCUMENTS

2007/0092012 A1 *  4/2007  Wilhelmsson ........ H04L 25/023
                                                              375/260

OTHER PUBLICATIONS

Brueninghaus et al. 2005. Link performance models for system level simulations of broadband radio acess systems. *2005 IEEE 16th International Symposium on Personal, Indoor and Mobile Radio Communications*, Berlin, vol. 4, pp. 2306-2311.
(Continued)

*Primary Examiner* — Jean B Corrielus
(74) *Attorney, Agent, or Firm* — Knobbe Martens Olson & Bear LLP

(57) ABSTRACT

One embodiment described herein relates to a method of predicting the performance of a communication system on a transmission channel. The system may comprise a transmitter suitable for applying bit interleaved coded modulation to information bits issued by a source to generate coded symbols, these coded symbols being transmitted by the transmitter over the transmission channel. The coded modulation may be based on a turbo-code comprising at least two constituent codes. The system may also comprise an iterative receiver, suitable for performing an iterative interference cancellation technique to process the coded symbols received from the transmission channel, the iterative receiver comprising an equalizer, a demodulator, and a turbo-decoder that are activated during each iteration performed by the iterative receiver. The turbo-decoder may comprise at least two decoders suitable for decoding the (Continued)

respective constituent codes of the turbo-code, the decoders being suitable for interchanging probabilistic quantities in an iterative manner.

16 Claims, 8 Drawing Sheets

(51) Int. Cl.
    *H04L 25/03*     (2006.01)
    *H04L 25/06*     (2006.01)
    *H03M 13/29*     (2006.01)

(52) U.S. Cl.
    CPC ....... *H04L 25/03891* (2013.01); *H04L 25/067* (2013.01); *H03M 13/2957* (2013.01); *H04L 2025/03426* (2013.01)

(56) References Cited

OTHER PUBLICATIONS

Ohlmer et al. 2009. Link adaptation in linearly precoded closed-loop MIMO-OFDM systems with linear receivers. *Proceedings IEEE ICC 2009*, Desden, Germany, 6 pages.

Ten Brink, S. 2001. Convergence behavior of iteratively decoded parallel concatenated codes. *IEEE Transactions on Communications*, 49(10):1727-1737.

Visoz et al. 2010. Semi-analytical performance prediction methods for iterative MMSE-IC multiuser MIMO joint decoding. *IEEE Transactions on Communications*, 58(9):2576-2589.

International Search Report mailed May 20, 2014 for International Application No. PCT/FR2014/050264 filed Feb. 11, 2014, 3 pages.

\* cited by examiner

METHOD AND DEVICE FOR PREDICTING THE PERFORMANCE OF A SYSTEM FOR COMMUNICATION OVER A TRANSMISSION CHANNEL

RELATED APPLICATIONS

This application is the U.S. National Phase of Application No. PCT/FR2014/050264 entitled "A METHOD AND A DEVICE FOR PREDICTING THE PERFORMANCE OF A COMMUNICATION SYSTEM OVER A TRANSMISSION CHANNEL" filed Feb 11, 2014, which designated the United States, and which claims the benefit of French Application No. 1351212 filed Feb 13, 2013.

BACKGROUND OF THE INVENTION

The invention relates to the general field of telecommunications.

The invention relates more particularly to a method of predicting the performance of a digital communications system.

The invention applies in preferred but non-limiting manner to the context of a wireless telecommunications network, e.g. a long term evolution (LTE) network as defined by the third group partnership project (3GPP), in which it is envisaged adapting the resources used by a transmitter in order to transmit data to a receiver as a function of the quality of the radio link between the transmitter and the receiver (in other words as a function of the transmission channel between the transmitter and the receiver and as a function of performance, in particular in terms of error probability, that can be achieved over that channel by the system). By way of example, the transmitter may be a mobile terminal, and the receiver may be a base station in the wireless network controlling the cell in which the mobile terminal is to be found.

The resources used by the transmitter depend on the level of protection that it is desired to give to the data transmitted by the transmitter to the receiver. This level of protection varies as a function of the modulation and coding scheme (MCS) used by the transmitter: the greater the spectral efficiency of the MCS, the smaller the resulting data protection, and thus the quality of the radio link needs to be good in order to enable transmission to take place reliably over the link.

Adapting the radio link thus consists in adapting the instantaneous data rate on transmission to the quality of the channel by selecting an appropriate MCS for the transmitter on each transmission.

In a wireless telecommunications network, this adaptation relies on there being a feedback channel between the transmitter and the receiver, which feedback channel is generally of limited data rate. This adaptation comprises three main stages:

the transmitter sends pilot symbols that are known to the receiver;
on the basis of the pilot symbols, the receiver estimates the quality of the radio link with the transmitter. This radio link quality is representative of the performance to be expected from the transmitter under current conditions of the channel. As a function of this quality, the receiver selects an MCS that is appropriate for the transmission channel, and uses the feedback channel to give the transmitter an indication enabling it to identify the MCS; and
the transmitter transmits data to the receiver using the MCS as selected in this way.

The strategy used for adapting the radio link depends on several factors, and in particular on the type of coding used on transmission, on the instantaneous characteristics of the transmission channel, on the type of equalizer and on the type of decoding used on reception. This strategy must enable adaptation to be performed quickly and efficiently so as to enable it to be implemented in real time in the telecommunications network, and in particular in the medium access control (MAC) layer in the mechanisms for taking decisions and allocating resources to the terminals.

Various strategies already exist in the state of the art that enable the radio link to be adapted quickly when the link is a multiple antenna channel with block fading that is selective in time and/or in frequency. Those strategies rely on abstracting the physical layer, and more precisely on semi-analytic modeling of the behavior of the receiver. This modeling is used to predict the performance of the transmission system including the transmitter and the receiver, in particular in terms of transmission error probability.

The document by E. Ohlmer and G. Fettweis entitled "Link adaptation in linearly precoded closed-loop MIMO-OFDM system with linear receivers", Proceedings IEEE ICC'09, Dresden, Germany, June 2009, proposes modeling the physical layer of a multiple-input multiple-output (MIMO) orthogonal frequency division multiplexing (OFDM) system implementing a linear receiver.

That modeling relies on evaluating, at the output from the linear receiver, a single signal to interference plus noise ratio (SINR) representing the quality of the radio link, and associated with an equivalent additive white Gaussian noise (AWGN) channel. This single SINR results from "compressing" a plurality of "intermediate" SINRs that are available at the output from the receiver, using a metric known as a mutual information effective SINR metric (MIESM), as described in particular in the document by K. Brueninghaus et al. entitled "Link performance models for system level simulations of broadband radio access systems", Proceedings IEEE PIMRC'05, Berlin, Vol. 4, pp. 2306-2311, September 2005.

More precisely, for each intermediate SINR, a pre-established correspondence table (or look-up table (LUT)) is used to determine the mutual information of an equivalent AWGN channel at the intermediate SINR. Thereafter, on the assumption that the equivalent AWGN channels associated with the intermediate SINRs are parallel and independent, the mean is evaluated of the mutual information as determined in this way.

The resulting mean mutual information is transformed into a single SINR using the pre-established correspondence table. The single SINR constitutes a metric for the quality of the radio link. It can then be compared with error probability curves prepared for a variety of MCSs as a function of SINR, so as to select the MCS that presents the greatest spectral efficiency while complying with a given error probability.

Other models of the physical layer have been proposed for receivers that are more complex than linear receivers, and in particular for receivers using successive interference cancellation techniques.

Thus, the document by R. Visoz et al. (referred to below as D1) entitled "Semi-analytical performance prediction methods for iterative LMMSE-IC multiuser MIMO joint decoding", IEEE Transactions on Communications, Vol. 58, No. 9, pp. 2576-2589, September 2010, describes modeling the physical layer and predicting performance on a channel with block fading that is selective in time or in frequency, for a multiuser MIMO communication system having a transmitter using an MCS and a non-linear iterative receiver performing an iterative technique of successive interference cancellation.

The MCS envisaged in D1 is binary interleaved coded modulation (BICM) and its space-time generalization (also known as space time bit interleaved coded modulation (STBICM)) when the transmitter has a plurality of transmit antennas and the receiver has a plurality of receive antennas.

FIG. 1 is a well-known diagram of STBICM modulation. The modulation is made up of an external binary error corrector code, specifically a binary convolutional code (CC) suitable for coding a plurality of information bits into coded bits, a space time interleaver (ST-II) suitable for interleaving the coded bits over a plurality of transmit antennas, and one modulator per transmit antenna that is suitable for supplying the symbols of a given constellation from coded bits associated with each transmit antenna. No assumption is made about the labeling used by the modulators.

The iterative receiver comprises a multiuser detector (i.e. an equalizer), namely a linear minimum mean-square error iterative cancellation (LMMSE-IC) detector that feeds a bank of demodulators and soft-input soft-output (SISO) decoders (one demodulator and one decoder per user). Inputs and outputs are said to be "soft" when the SISO decoders receive non-binary values as inputs, such as for example probabilistic quantities, and also deliver outputs that are non-binary.

Each SISO decoder implements a BCJR algorithm (named for its inventors, Bahl, Cocke, Jelinek, and Raviv), which optimizes the bitwise maximum a posteriori (MAP) criterion. The multiuser detector, the demodulators, and the decoders exchange soft information about the coded bits and the symbols of the STBICM, at each iteration of the receiver.

More precisely, on each iteration i of the iterative receiver, each SISO decoder uses probabilistic observations and quantities representative of a priori probabilities that are available thereto about the coded bits associated with the symbols of the STBICM (as supplied by the demodulator) to evaluate probabilistic quantities representative of the a posteriori probabilities about those coded bits. These a posteriori probabilities represent the probabilities of these coded bits being transmitted. In D1, the probabilistic quantities received and supplied by each SISO decoder are log likelihood ratios (LLRs), that is probability ratios. In the description below, for simplification purposes, the logarithmic a posteriori probability ratios are abbreviated LAPPR and the log extrinsic probability ratios are abbreviated LEXTPR.

The LAPPRs estimated by the SISO decoder are used firstly to calculate variance on the STBICM symbols that is then supplied to the multiuser detector for use by that detector in iteration i+1 in order to detect the STBICM symbols, and secondly in order to calculate the LEXTPRs on the coded bits, which supply a measure of the reliability of the LAPPRs.

These LEXTPRs are used as logarithmic a priori probability ratios on the coded bits by the demodulator associated with that decoder on iteration i+1. The demodulator in turn supplies the LEXTPRs on the coded bits to the SISO decoder, which uses them as logarithmic a priori probability ratios on the coded bits during decoding performed in iteration i+1.

D1 proposes a method of predicting the performance of the transmission system on each iteration i of the iterative receiver, which relies:

- on semi-analytic modeling of the behavior of the multiuser detector with the help of an SINR resulting from the compression by means of the MIESM of a plurality of SINRs calculated on the STBICM symbols at the output from the detector, for each transmit antenna and for each block of the channel with fading. These SINRs depend on the estimate of the transmission channel between the transmitter and the receiver, on an estimate of the variance of the noise (possibly also including certain sources of interference that are modeled as noise), and on the variance of the STBICM symbols at the input to the detector; and
- on joint modeling of the demodulator and of the SISO decoder of each user, operating on the STBICM symbols delivered at the output from the multiuser detector, this modeling being based on analyzing the variation in the mean mutual information between the coded bits associated with each STBCIM symbol and the LEXTPRs on these coded bits as available at the output from the SISO decoder.

The variation in the mutual information is determined by using a three-dimensional correspondence table that is pre-established using Monte-Carlo simulations, and that, for a given value of the mean mutual information between the coded bits of the STBICM symbols and the logarithmic a priori probability ratios on these coded bits at the input to the demodulator, and for a given value of the mean mutual information associated with the compressed SINR, gives a value for the mean mutual information between the coded bits of the STBICM symbols and the LEXTPRs on these coded bits as available at the output from the decoder.

It should be observed that this three-dimensional correspondence table is no longer necessary if Gray labeling is envisaged for the STBICM modulation. There is then no longer any need to track the mean mutual information between the coded bits and the logarithmic a priori probability ratios on these coded bits.

D1 also proposes using a similar correspondence table to establish the error probability at the output from the decoder on each iteration of the iterative receiver, and also the variance of the coded symbols. The variance of the coded symbols as determined on iteration i is used during iteration i+1 to estimate the compressed SINR. It should be observed that this three-dimensional correspondence table becomes two-dimensional, providing Gray labeling is envisaged for the STBICM.

The prediction method proposed in D1 makes it possible in accurate and rapid manner to estimate the performance of a communications system using, on transmission, coded modulation built up from a simple convolutional code, and using, on reception, optimum decoding of the convolutional code using the bitwise MAP criterion.

Nevertheless, the method is not suitable when, on transmission, use is made of coded modulation built up from codes that are more complex, such as composite codes, and in particular turbo-codes.

A turbo-code is an error-correcting code based on concatenating a plurality of elementary constituent codes (typically two of them), that are separated by an interleaver. The constituent codes may for example be recursive and systematic convolutional codes. Turbo-codes are known for their excellent performance, and they are in widespread use nowadays in wireless telecommunications standards, and in particular in the LTE standard.

Unlike convolutional codes, because of their special structure, turbo-codes are difficult to decode in optimum manner on the basis of a bitwise MAP criterion, even for code lengths that are quite short. That is why, in practice, recourse is had to sub-optimum iterative decoding based on using elementary SISO decoders (associated with the respective constituent codes of the turbo-code), with the decoders interchanging probabilitistic quantities on each decoding iteration.

It can readily be understood that under such circumstances, the modeling envisaged in D1 cannot take account of using such an iterative decoding scheme at the receiver.

There therefore exists a need for a method of predicting the performance of a communications system relying, on transmission, on using an STBICM built up from a turbo-code, and relying, on reception, on an iterative receiver implementing a detector performing successive interference cancellation and an iterative sub-optimum decoder.

OBJECT AND SUMMARY OF THE INVENTION

The invention serves in particular to remedy this need by proposing a method of predicting performance on a transmission channel having multiple inputs and outputs, in a communication system comprising:
  a transmitter suitable for applying bit interleaved coded modulation to information bits issued by a source so as to generate coded symbols, these coded symbols being transmitted by the transmitter over the transmission channel, the coded modulation being based on a turbo-code comprising at least two constituent codes; and
  an iterative receiver, suitable for performing an iterative interference cancellation technique in order to process the coded symbols received from the transmission channel, the iterative receiver comprising an equalizer, a demodulator, and a turbo-decoder that are activated during each iteration performed by the iterative receiver, the turbo-decoder comprising at least two decoders suitable for decoding the respective constituent codes of the turbo-code, the decoders being suitable for interchanging probabilistic quantities in an iterative manner;
  the prediction method comprising, for each iteration i of the iterative receiver:
    a first determination step of determining a value $\bar{\gamma}_{Eq}^{(i)}$ representative of a signal to interference plus noise ratio at the output from the equalizer from an estimate of the transmission channel and from an estimate $\bar{v}$ of the variance of the coded symbols at the input to the equalizer at iteration i, this determination being performed by using a preestablished function characterizing the behavior of the equalizer; and
    a second determination step of determining:
      a transmission error probability $P_e(i)$ on the channel;
      a variance $\bar{v}_i$ of the coded symbols at the output from the turbo-decoder; and
      mean mutual information $I_{E,DEC}^{(i)}$ between the information bits transmitted by the source and probabilistic quantities representative of extrinsic probabilities on those information bits supplied at the output from the turbo-decoder;
    this determination being done from the value $\bar{\gamma}_{Eq}^{(i)}$ and from "a priori" mean mutual information $I_{A,DEC}^{(i)}$ between the information bits issued by the source and probabilistic quantities representative of a priori probabilities on these information bits available at the input of the turbo-decoder at iteration i, by using preestablished functions characterizing the behavior of the demodulator and of the turbo-decoder for a predetermined number of decoding iterations performed by the turbo-decoder;

the variance $\bar{v}_i$ being used during the first determination step of the following iteration i+1 of the iterative receiver to estimate the variance $\bar{v}$ of the coded symbols at the input of the equalizer, and the mean mutual information $I_{E,DEC}^{(i)}$ being used during the second determination step of iteration i+1 as a priori mean mutual information $I_{A,DEC}^{(i+1)}$.

Correspondingly, the invention also provides a device for predicting the performance, on a transmission channel, of a communication system comprising:
  a transmitter suitable for applying bit interleaved coded modulation to information bits issued by a source so as to generate coded symbols, these coded symbols being transmitted by the transmitter over the transmission channel, the coded modulation being based on a turbo-code comprising at least two constituent codes; and
  an iterative receiver, suitable for performing an iterative interference cancellation technique in order to process the coded symbols received from the transmission channel, the iterative receiver comprising an equalizer, a demodulator, and a turbo-decoder that are activated during each iteration performed by the iterative receiver, the turbo-decoder comprising at least two decoders suitable for decoding the respective constituent codes of the turbo-code, the decoders being suitable for interchanging probabilistic quantities in an iterative manner;
  the device comprising a module suitable, on each iteration i of the iterative receiver, for activating:
    a first modeling module suitable for determining a value $\bar{\gamma}_{Eq}^{(i)}$ representative of a signal to interference plus noise ratio at the output from the equalizer from an estimate of the transmission channel and from an estimate $\bar{v}$ of the variance of the coded symbols at the input to the equalizer at iteration i, this determination being performed by using a preestablished function characterizing the behavior of the equalizer; and
    a second modeling module, suitable for determining:
      a transmission error probability $P_e(i)$ on the channel;
      a variance $\bar{v}_i$ of the coded symbols at the output from the turbo-decoder; and
      a mean mutual information $I_{E,DEC}^{(i)}$ between the information bits transmitted by the source and probabilistic quantities representative of extrinsic probabilities on those information bits supplied at the output from the turbo-decoder (i.e. at the end of the last activation of the last decoder of the turbo-decoder);
    this determination being done from the value $\bar{\gamma}_{Eq}^{(i)}$ and from "a priori" mean mutual information $I_{A,DEC}^{(i)}$ between the information bits issued by the source and probabilistic quantities representative of a priori probabilities on these information bits available at the input of the turbo-decoder at iteration i, said second modeling module using preestablished functions characterizing the behavior of the demodulator and of the turbo-decoder for a predetermined number of decoding iterations performed by the turbo-decoder;
    the variance $\bar{v}_i$ being used by the first modeling module at the following iteration i+1 of the iterative receiver to estimate the variance $\bar{v}$ of the coded symbols at the input of the equalizer, and the mean mutual information $I_{E,DEC}^{(i)}$ being used by the second modeling module at iteration i+1 as a priori mean mutual information $I_{A,DEC}^{(i+1)}$.

Each decoding iteration performed by the turbo-decoder corresponds to activating each of the decoders of the turbo-decoder.

The term "probabilistic quantities" is used in the meaning of the invention to cover probabilities or probability densities on symbols and/or bits, or indeed log likelihood ratios (LLR) of probabilities or of probability densities.

The invention thus proposes an effective and rapid prediction method making it possible to estimate the performance of a communication system relying on coded modulation based on a turbo-code (BICM or STBICM) and using an iterative receiver implementing an iterative interference-cancellation technique and incorporating a sub-optimal iterative decoder of the turbo-code. That is how the invention adds to the modeling proposed in D1, which is not itself capable of handling the use of a turbo-code on transmission and of an iterative decoder on reception.

It should be observed that the interference that the iterative receiver seeks to eliminate may be of various kinds: it may be interference associated with the presence of multiple paths in the channel or with the use of multiple multi-antenna antennas, or multi-user interference, etc.

The prediction method of the invention relies on:
firstly, modeling the behavior of the equalizer by means of a single SINR ratio associated with the coded symbols at the output from the equalizer; and
secondly, on joint modeling of the demodulator and of the sub-optimal iterative decoder of the turbo-code (turbo-decoder). For this purpose, and in order to take account of the specific features of the turbo-decoder, the invention advantageously proposes keeping track of variations in the mean mutual information relating to the extrinsic probabilistic quantities that are available at the output from the turbo-decoder on the information bits issued by the source, in other words, given the structure of the turbo-decoder, the mean mutual information relating to the extrinsic probability quantities delivered at the output from the last decoder of the turbo-decoder (i.e. supplied by the second decoder for a two-level turbo-code) and that makes it possible to decode the first code constituting the turbo-code on the next "global" iteration of the receiver. A "global" iteration corresponds to activating the detector (subtracting interference and filtering) and the turbo-decoder, which may in itself include a plurality of internal decoding iterations.

Keeping track in this way makes it possible to characterize reliably the behavior of the demodulator and of the turbo-decoder, while taking account of their specific features, and in particular of the probabilistic information that is exchanged between these entities.

In order to propose a prediction method that is simple and fast and that is suitable for use in real-time and for being incorporated in a receiver such as a terminal, the modeling of the behavior of the equalizer is performed via a preestablished function that makes it possible, from an estimate of the transmission channel and from the estimate $\bar{v}$ of the variance of the coded symbols at the input of the equalizer, to determine a signal to interference plus noise ratio (SINR) $\bar{\gamma}_{Eq}^{(i)}$ at the output from the equalizer.

For certain equalizers, and in particular for an equalizer of the LMMSE-SIC type, this function may advantageously be defined analytically or semi-analytically.

Thus, by way of example, when the equalizer is an LMMSE-SIC detector, the transmission channel is a MIMO block fading channel with nb blocks, and the transmitter transmits coded symbols over nt transmit antennas, the first determination step comprises:
an estimation step of estimating a signal to interference plus noise ratio $\bar{\gamma}_{b;t}^{(i)}$ at the output from the equalizer for each block b of the fading channel and for each transmit antenna t of the transmitter with the help of a preestablished function $\Phi_{b;t}$; and
an estimation step, for each signal to interference plus noise ratio $\bar{\gamma}_{b;t}^{(i)}$, of estimating mean mutual information $I_{LE_{b;t}}^{(i)}$ of an additive white Gaussian noise channel of variance $1/\gamma_{b;t}^{(i)}$ (for symbol power normalized to 1), by using a preestablished invertible function $\psi$;
the value $\bar{\gamma}_{Eq}^{(i)}$ being determined using the following equation:

$$\bar{\gamma}_{Eq}^{(i)} = \psi^{-1}\left(\frac{1}{n_b n_t}\sum_{b=1}^{n_b}\sum_{t=1}^{n_t} I_{LE_{b;t}}^{(i)}\right)$$

The function $\psi$ depends on the coded modulation used on transmission.

Thus, in other words, in this particular implementation, $\bar{\gamma}_{Eq}^{(i)}$ is an SINR compressed using the MIESM metric from the SINRs of each transmit antenna and each block of the transmission channel. These SINRs for each transmit antenna and each block of the transmission channel are estimated with the help of a predetermined function $\Phi_{b;t}$ that depends on the estimate of the MIMO channel corresponding to the block b and to the antenna t and on the variance of the noise on that channel.

In a variant, for other equalizers, it is possible to envisage establishing the functions $\Phi_{b;t}$ and $\psi$ by Monte Carlo simulation if it is difficult to establish in semi-analytical manner a quantity that is equivalent to a single signal to interference plus noise ratio $\bar{\gamma}_{Eq}^{(i)}$ at the output from the equalizer.

The function $\psi$ that serves to calculate the mutual information in the above-described implementation may be stored in the form of a two-dimensional correspondence table or look up table (LUT) so as to accelerate the execution of the prediction method of the invention.

Furthermore, an approximate analytical formula for $\Phi_{b;t}$ may advantageously be used for rapidly obtaining an estimate of the SINR $\gamma_{b;t}^{(i)}$. This function depends on numerous scalar variables, such that it is preferable to use such an approximation rather than use a correspondence table.

As mentioned above, the joint modeling of the behavior of the demodulator and of the turbo-decoder relies on using preestablished functions that depend on two variables, namely the SINR $\bar{\gamma}_{Eq}^{(i)}$ and the mean mutual information relating to probabilistic quantities representative of a priori probabilities on the information bits available at the input of the turbo-decoder, in other words at the input of the first decoder of the turbo-decoder.

By modeling the external iterative equalizer and by joint modeling of the demodulator and of the turbo-decoder, the invention makes it possible to track the variation of two dynamic entities that are nested in the iterative receiver, which entities exchange soft information at each iteration of the iterative receiver. The exchanges between the two entities are also modeled in accordance with the invention firstly via the SINR $\bar{\gamma}_{Eq}^{(i)}$ from the first determination step, which is used during the second determination step, and secondly via the variance $\bar{v}_i$ of the coded symbols from the second determination step, which are used during the first determination step at the following iteration.

Variation in the external iterative equalizer is thus analyzed through the variation of the variance of the coded symbols, whereas the variation of the demodulator and of the turbo-decoder is analyzed through the variation in the mean mutual information on the extrinsic probabilistic quantities supplied at the output of the turbo-decoder, which is then used as mean mutual information on the a priori probabilistic quantities at the following iteration.

In an implementation of the invention:
the preestablished function characterizing the behavior of the equalizer is stored in the form of a two-dimensional correspondence table; and
the preestablished functions characterizing the joint behavior of the demodulator and of the turbo-decoder are stored in the form of three-dimensional correspondence tables.

Furthermore, as mentioned above, for a detector of the LMMSE-SIC type, the functions $\Phi_{b;t}$ representing the SINR at the output from the detector after subtracting the interference for each block b of the fading channel and each antenna t of the transmitter can be defined analytically.

As a result, it suffices to read the correspondence tables in order to obtain estimates of the SINR $\bar{\gamma}_{Eq}^{(i)}$, of the error probability $P_e(i)$, of the variance $\bar{v}_i$, and of the mean mutual information $I_{E,DEC}^{(i)}$. This can be done very quickly. Performing the invention thus requires little calculation and processing capacity, and it relies essentially on capacity to store the correspondence tables.

In a particular implementation of the invention, the function used for determining the variance $\bar{v}_i$ is preestablished by assuming that the variance of the coded symbols at the output from the turbo-decoder is estimated by the iterative receiver from probabilistic quantities representative of a posteriori probabilities supplied by the turbo-decoder on the coded bits.

This implementation involves predicting performance of a communication system that relies on an iterative receiver within which the turbo-decoder supplies probabilistic quantities representative of a posteriori probabilities, such as LAPPRs, in order to estimate the variance of the symbols at the following iteration at the input of the equalizer.

In another implementation, the function used for determining the variance $\bar{v}_i$ is preestablished by assuming that the variance of the coded symbols at the output from the turbo-decoder is estimated by the iterative receiver from probabilistic quantities representative of extrinsic probabilities supplied by the turbo-decoder on the coded bits.

This implementation involves predicting performance of a communication system that relies on an iterative receiver within which the turbo-decoder supplies probabilistic quantities representative of extrinsic probabilities, such as LEXTPRs, in order to estimate the variance of the symbols at the following iteration at the input of the equalizer.

Specifically, it has recently been shown that an iterative receiver of a multi-antenna or multi-user communication system based on variance of the coded symbols estimated from LAPPRs supplied by the turbo-decoder presents performance, under conditions in which interference is large (e.g. for MCSs with high rates, and/or interference between symbols that is severe, and/or a channel that is spatially loaded, i.e. for which the number of transmit antennas is greater than the number of receive antennas), that is better than the performance of an iterative receiver relying on variance of the coded symbols as estimated from LEXTPRs supplied by the turbo-decoder. This can be explained in part because the use of LAPPRs instead of LEXTPRs leads to greater reliability for symbols estimated by the equalizer in such scenarios: the additional information obtained by the equalizer by means of the LAPPRs enables it to cancel more interference on each iteration.

Nevertheless, the use of probabilistic quantities of the a posteriori type instead of the extrinsic type leads to adopting certain assumptions (in particular concerning the independence of certain probabilistic quantities) in the modeling of entities of the iterative receiver of the invention that are not true in practice. As a result, certain inaccuracies in the prediction of performance can be encountered under certain assumptions, resulting in an error probability as predicted in accordance with the invention being less than the real error probability of the communication system as obtained by simulation.

In order to remedy that drawback, when the function used for determining the variance $\bar{v}_i$ is preestablished by assuming that the variance of the coded symbols at the output from the turbo-decoder is estimated by the iterative receiver from probabilistic quantities representative of a posteriori probabilities supplied by the turbo-decoder on the coded bits, the variance of the coded symbols at the input of the equalizer at iteration i+1 is estimated as follows:

$$\bar{v} = \min(\beta \bar{v}^{(i)}, 1)$$

where $\beta$ designates a weighting factor.

The inventors have found that such weighting makes it possible to provide effective correction of the predicted error probability, thereby making it very close to the probability obtained by simulation.

Exhaustive simulations carried out by the inventors have also shown that the weighting factor depends on the coding and modulation scheme envisaged for transmission, but in contrast does not vary significantly as a function of the number of transmit and/or receive antennas nor as a function of the characteristics of the channel (time and/or frequency selectivity).

Various criteria can be envisaged for selecting this weighting factor $\beta$.

Thus, for example, it may be selected so as to minimize the sum, over all of the iterations performed by the iterative receiver and over a large number K of realisations of the transmission channel, of distances evaluated between the error probability estimated during the second determination step and an error probability obtained by simulating the performance of the transmission system for those iterations and for those transmission channel realisations.

In a variant, the weighting factor $\beta$ may be selected so as to minimize, for a determined iteration of the iterative receiver, the sum over a large number K of realisations of the transmission channel of distances evaluated between the error probability estimated during the second determination step and an error probability obtained by simulating the performance of the transmission system for those transmission channel realisations and for that determined iteration.

It should be observed that when the variance used by the equalizer is estimated from LEXTPR or from equivalent probabilistic quantities on the coded bits supplied by the turbo-decoder, such calibration becomes negligible or indeed useless.

The overall performance of the communication system is given by the error probabilities estimated at each iteration.

In an implementation of the invention, the error probability $P_e(i)$, the variance $\bar{v}_i$ and the mutual information $I_{E,DEC}^{(i)}$ are determined after a decoding iteration of the turbo-decoder.

The inventors have found that a decoding iteration of the turbo-decoder makes it possible to optimize the performance of an iterative receiver making use of interference subtraction for a sufficiently large number of global iterations of the iterative receiver.

Nevertheless, for reasons of time constraints, it is also possible, in a variant, to iterate several times within the turbo-decoder before moving on to subtracting interference.

Thus, in this variant, the error probability $P_e(i)$, the variance $\bar{v}_i$, and the mutual information $I_{E,DEC}^{(i)}$ are determined after a plurality of decoding iterations of the turbo-decoder. It then suffices to take $I_{E,DEC}^{(i)}$ into consideration at the last of the internal iterations of the turbo-code.

In a particular implementation of the invention, the bit interleaved coded modulation is based on Gray labeling. As a result, a model is obtained of the behavior of the demodulator that is simplified. Furthermore, this implementation presents advantages known to the person skilled in the art for wireless transmission channels.

In a particular implementation, the various steps of the prediction method are determined by computer program instructions.

Consequently, the invention also provides a computer program on a data medium, the program being suitable for being performed in a predictor device or more generally in a computer, the program including instructions adapted to performing steps of the prediction method as described above.

The program may use any programming language, and it may be in the form of source code, object code, or code intermediate between source code and object code, such as in a partially compiled form, or in any other desirable form.

The invention also provides a computer readable data medium, including instructions of a computer program as mentioned above.

The data medium may be any entity or device capable of storing the program. For example, the medium may comprise storage means such as a read only memory (ROM), for example a compact disk (CD) ROM or a microelectronic circuit ROM, or indeed magnetic recording means, e.g. a floppy disk or a hard disk.

Furthermore, the data medium may be a transmissible medium such as an electrical or optical signal that can be conveyed via an electrical or optical cable, by radio, or by other means. The program of the invention may in particular the downloaded from a network of the Internet type.

Alternatively, the data medium may be an integrated circuit in which the program is incorporated, the circuit being adapted to execute or to be used in the execution of the method in question.

In another aspect, the invention provides a communication system comprising:
- a transmitter suitable for applying bit interleaved coded modulation to information bits issued by a source so as to generate coded symbols, these coded symbols being transmitted by the transmitter over the transmission channel, the coded modulation being based on a turbo-code comprising at least two constituent codes; and
- an iterative receiver, suitable for performing an iterative interference cancellation technique in order to process the coded symbols received from the transmission channel, the iterative receiver comprising an equalizer, a demodulator, and a turbo-decoder that are activated during each iteration performed by the iterative receiver, the turbo-decoder comprising at least two decoders suitable for decoding the respective constituent codes of the turbo-code, the decoders being suitable for interchanging probabilistic quantities in an iterative manner;
- the receiver also comprising a predictor device of the invention.

The communication system of the invention benefits from the same advantages as those mentioned above for the prediction method and device.

As mentioned above, a preferred but nonlimiting application of the invention lies in adapting the radio link in a wireless telecommunications network.

Thus, the invention also provides the use of a performance prediction method of the invention in a method of adapting a radio link implemented by a communication system having a transmitter and an iterative receiver, the adaptation method comprising selecting a bit interleaved coded modulation based on a turbo-code from a predetermined set of coding and modulation schemes available to the transmitter as a function of the error probability determined by the prediction method for that bit interleaved coded modulation at a predetermined iteration of the iterative receiver.

In other implementations, it is also possible to envisage that the prediction method, the predictor device, the communication system, and the radio link adaptation method of the invention present in combination all or some of the above-specified characteristics.

BRIEF DESCRIPTION OF THE DRAWINGS

Other characteristics and advantages of the present invention appear from the following description made with reference to the accompanying drawings and appendices, which show implementations having no limiting character.

In the figures.

Figure 1:
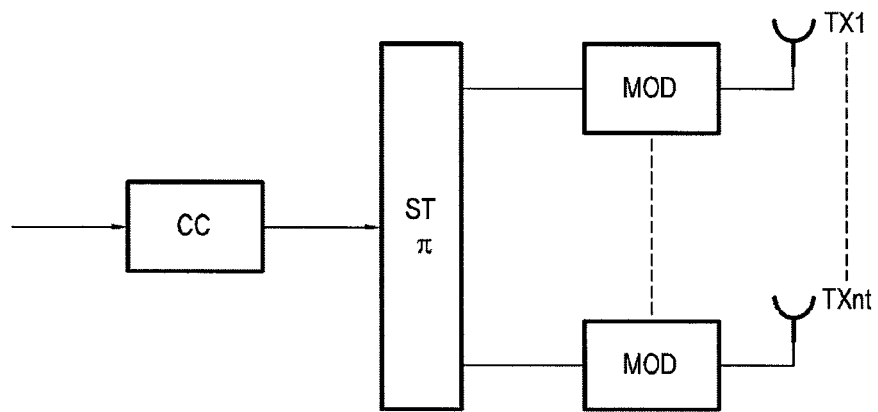
FIG. 1, described above, is a diagram showing STBICM modulation based on a convolutional code.
Figure 2:
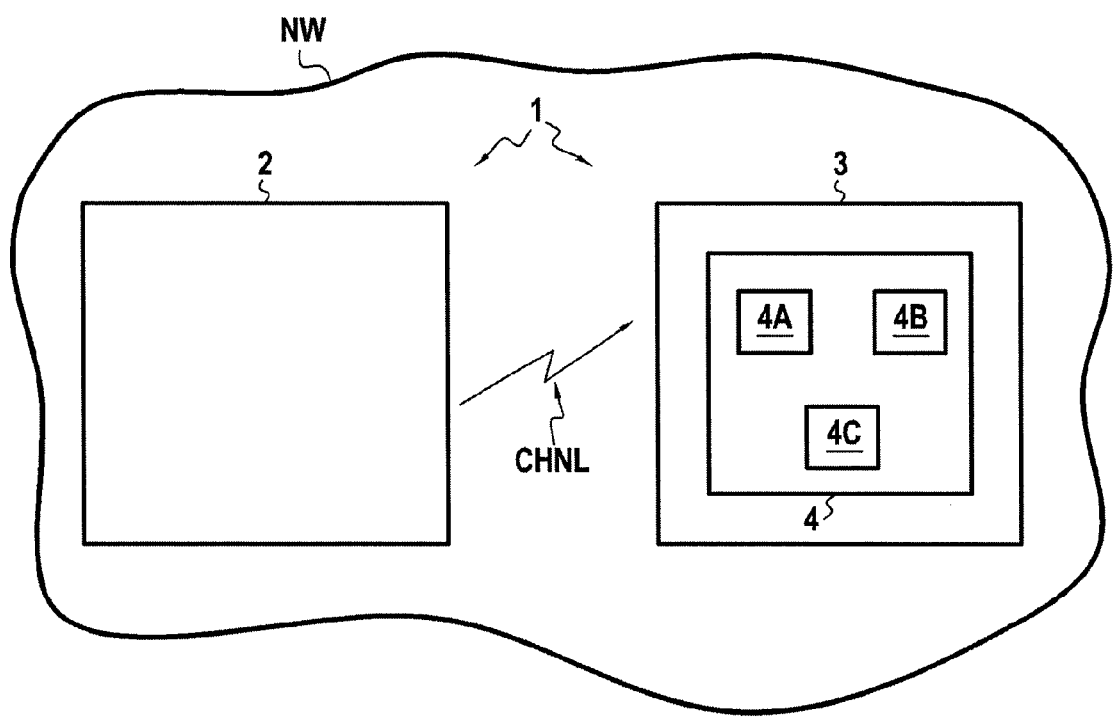
FIG. 2 shows a communication system of the invention comprising a transmitter and a receiver including a predictor device of the invention, in a particular embodiment.

In the Appendices:

Appendix 1 summarizes the main steps performed to establish the correspondence tables used during the prediction method of the invention; and Appendix 2 summarizes the main steps performed for simulating the performance of the FIG. 2 communication system.

DETAILED DESCRIPTION OF THE INVENTION

FIG. 2 shows, in its environment, a communication system 1 in accordance with the invention, operating in a wireless telecommunications network NW, in a particular embodiment.

No limitation is attached to the nature of the network NW, nor to the transmission techniques used on that network (e.g. single carrier or multicarrier transmission, etc.). It may be a long-term evolution (LTE) network, a universal mobile telecommunications system (UMTS) network, etc.

The communication system 1 comprises a transmitter 2 and a receiver 3, both provided with multiple antennas.
In the presently described example, the transmitter 2 is a mobile terminal having $n_t$ transmit antennas, and of the receiver 3 is a base station of the telecommunications network NW having $n_r$ receive antennas. In this example, the invention is thus applied to predicting the performance of the communication system 1 in the uplink direction.

Nevertheless, this assumption is not limiting, and the invention can equally be applied to predicting performance in the downlink direction, for transmissions from the base station (then considered as being the transmitter in the meaning of the invention) to the mobile terminal (then considered as being the receiver in the meaning of the invention).

There follows a detailed description of the operation of the transmitter 2 and of the receiver 3.
The following notation is used:
letters in bold designate matrices or vectors;
if A is a matrix, then the $k^{th}$ column of A is written $a_k$. The entry (i,j) of A is written $a_{i,j}$ or $[A]_{i,j}$;
$0_n$ designates a zero vector of size n;
$I_n$ is the identity matrix of dimensions n×n (i.e. having n rows and n columns);
the exponents *, $T$, and $†$ designate respectively the complex conjugate operator, the transposition operator, and the hermitian operator;
a discrete random variable X has a probability mass function (pmf) P(X);
a continuous random variable x has a probability density function (pdf) $p_x(x)$; and
$N_C(m,v)$ designates a circularly symmetrical Gaussian complex probability density function of mean m and of variance v; $N_C(m, V)$ designates a circularly symmetrical Gaussian complex multidimensional probability density function of mean vector m and of covariance matrix V.

Figure 3:
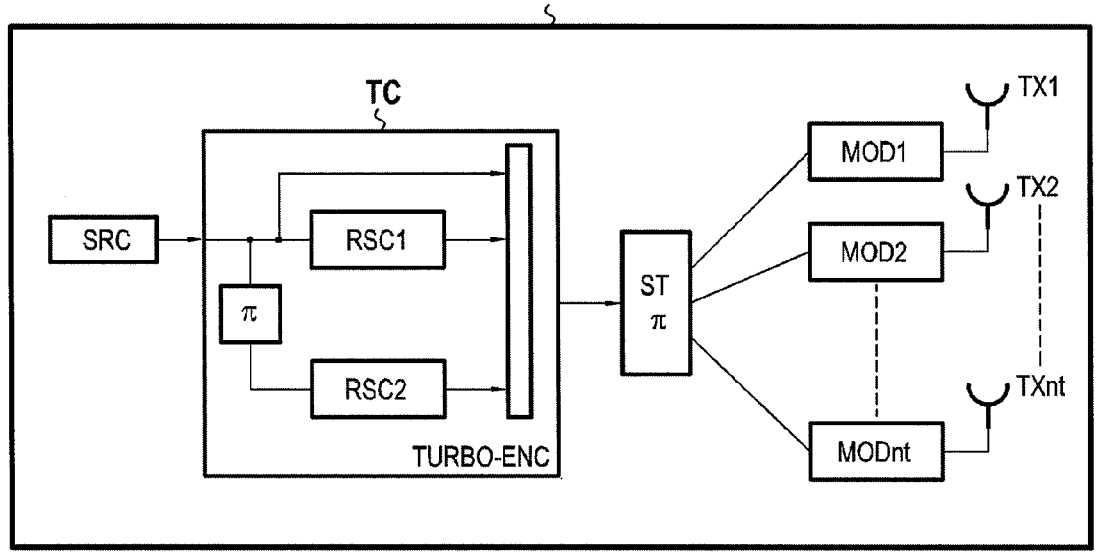
FIG. 3 shows the modulation and coding scheme used by the FIG. 2 transmitter.

In the presently described example, and as shown in FIG. 3, the transmitter 2 uses space time binary interleaved code modulation or STBICM, based on a parallel turbo-code TC comprising two constituent codes RSC1 and RSC2 that are separated by a binary interleaver Π.

In this example, the constituent codes RSC1 and RSC2 are conventional recursive systematic convolutional codes of coding rate ½.

Nevertheless, no limitation is attached to the coding rate of the turbo-code, nor to the coding rate of its constituent codes, nor even to the number of constituent codes used in the turbo-code: for example it is thus possible to envisage puncturing the output of the turbo-code in order to obtain a determined coding rate, to use constituent codes and having coding rates other than ½, or indeed to use other constituent codes or some greater number of constituent codes, etc.

A vector having $n_d$ information bits, written $u \in F_2^{n_d}$ (with $F_2=GF(2)$), is issued by a source SRC and supplied to the input of a turbo-coder TURBO-ENC, implementing the turbo-code TC. The code word generated from the vector u by the turbo-coder is a vector $c \in F_2^{n_c}$ of dimension $n_c$.

Because of the structure of the turbo-code TC, this code word is made up of information bits issued by the source SRC, and coded bits generated in application of each code RSC1 and RSC2.

By abuse of language in the description below, the notation RSC1 and RSC2 is used interchangeably to designate the codes constituting the turbo-code TC or the encoders of the turbo-code TURBO-ENC implementing these constituent codes.

The coded bits of the code word c are then interleaved over the nt antennas of the transmitter 2 by a space-time binary interleaver ST-Π, which reorganizes them into a matrix D of dimensions $n_t \times n_{cu}$, $n_{cu}$ designating the number of channel uses, the channel being assumed to be constant for each transmission. Each input of this matrix is a sequence of q bits, where q is a predetermined integer depending on the constellation utilized for modulation, in other words: $D \in Z_{2^q}^{n_t \times n_{cu}}$.

Thereafter, for each transmit antenna TXn, n=1, ... $n_t$, a modulator MODn transforms the coded bits associated with the antenna into so-called "coded" symbols of a predetermined complex constellation C. By way of example, C is a constellation of quadrature phase shift keying (QPSK) symbols, of 16 state quadrature amplitude modulation (QAM-16) symbols, of QAM-64 symbols, etc. In the embodiment described, it is assumed that each modulator applies Gray labeling specified by μ.

The Gray labeling μ and the constellation C of cardinal number $2^q$ performed by each modulator MOD1, ..., $MODn_t$, result in the matrix D being transformed into a complex matrix S of dimensions $n_t \times n_{cu}$.

In the description below, $C_j^{(0)}$ and $C_j^{(1)}$ designate the subsets of points of the constellation C for which the labels (i.e. the sequences of q bits associated with the symbols of the constellation) have a 0 or a 1 at the position j. The value of the $j^{th}$ bit of the label at an arbitrary point s of the constellation C is also written $\mu_j^{-1}(s)$.

When a technique of the link adaptation type is performed in the transmitter 2, and because there exists a limited feedback path between the transmitter 2 and the receiver 3, it should be observed that only a finite number of modulation and coding schemes (MCS) are available at the transmitter 2. These schemes are defined by various parameters, such as, for example, the type of coding performed (e.g. turbo-code), the coding rate of the codes used, where applicable, the puncturing patterns and rates used at the outlet from the turbo-coder, the modulation constellations, etc.

The coded symbols are then transmitted via the $n_t$ transmit antennas of the transmitter 2 over a multiple input and multiple output (MIMO) transmission channel CHNL. In the presently described example, the channel CHNL is a frequency selective channel (i.e. with multiple paths), with block fading, and with additive white Gaussian noise (AWGN).

The number of fading blocks of the channel is written $n_b$. Each block is assumed to be constant over $n_s = n_{cu}/n_b$ channel uses.

In conventional manner, the transmission channel CHNL can be modeled by a set $\mathcal{H}$ of $n_b$ finite impulse responses $H_b(l)$, b=1, ..., $n_b$ describing the rapid variations of the channel due to multipath fading (small-scale fading):

$$H_b(l) = \sum_{\tau=0}^{n_T} H_{b,\tau} \delta(l-\tau) \quad (1)$$

where $n_T$ designates the number of paths of the channel. Each gain matrix $H_{b,\tau}$ is a random matrix of dimension $n_r \times n_t$ having entries that are circular Gaussian complex random variables that are independent and identically distributed (i.i.d), of zero mean and of variance $\sigma_{b,\tau}^2$ with $\Sigma_{\tau=0}^{n_\tau}\sigma_{b,\tau}^2=1$.

For simplification purposes, any correlation that might exist between the transmit antennas and/or the receive antennas is ignored in this example.

The transmission channel also introduces additive white Gaussian noise of zero mean.

Figure 4:
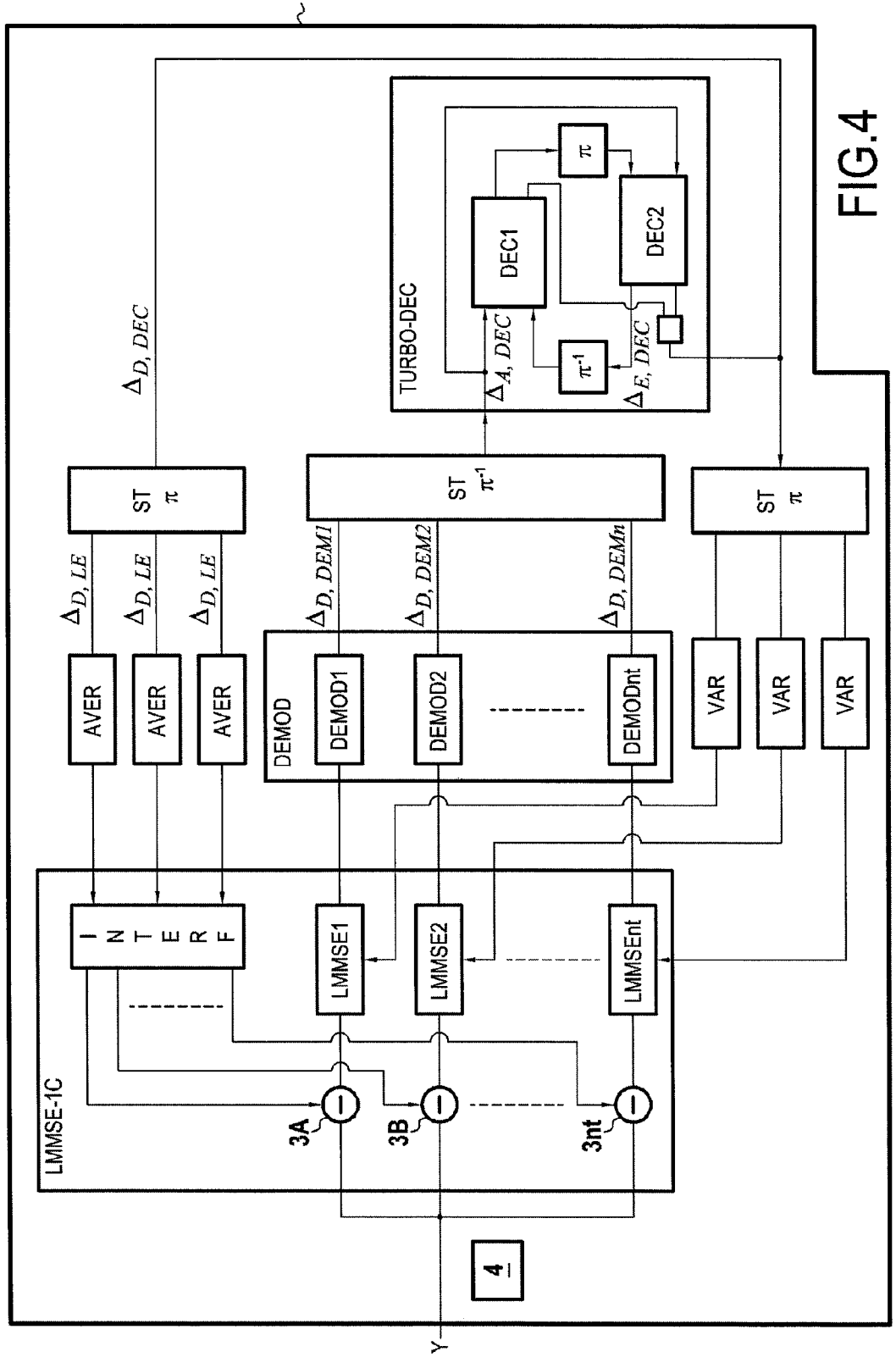
FIG. 4 shows the structure, in the physical layer, of the FIG. 2 receiver.

The coded symbols transmitted over the channel CHNL are received by the receive antennas of the receiver 3. The structure of the receiver 3 is shown in FIG. 4, for a number $n_b$ of blocks equal to 1. Generalizing this structure to an arbitrary number $n_b$ of blocks does not pose any difficulty for the person skilled in the art.

For simplification purposes, the presently described implementation is limited to single-user transmission. Nevertheless, generalizing to a multi-user environment likewise does not pose any difficulty for the person skilled in the art.

If $Y=\{Y_b\}_{b=1}^{nb}$, $S=\{S_b\}_{b=1}^{nb}$, and $D=\{D_b\}_{b=1}^{nb}$ designate respectively the set of coded symbol matrices received at the output of the channel by the receiver 3, the set of coded symbol matrices transmitted over the channel by the transmitter 2, and the set of coded bit matrices at the output from the interleaver ST-Π, for the various fading blocks of the channel, then the signal received on the block b at the instant l can be modeled by the following equivalent discrete base band model:

$$y_{b;l} = \sum_{\tau=0}^{n_\tau} H_{b,\tau} s_{b;l-\tau} + w_{b;l} \quad (2)$$

where $Y_{b;l} \in \mathbb{C}^{n_r}$ and $s_{b;l} \in \mathbb{C}^{n_t}$ are random i.i.d. vectors with $E[s_{b;l}]=0_{n_t}$ and $E[s_{b;l}s_{b;l}^\dagger]=I_{n_t}$, where $E[.]$ designates mathematical expectation, and where $w_{b;l} \in \mathbb{C}^{n_r}$ designate circularly symmetrical Gaussian i.i.d. random vectors of zero mean and of covariance matrix $\sigma_w^2 I_{n_r}$. The notation $\{d_{b;t,l,j}\}_{j=1}^q$ is used to designate the set of bits in the matrix $D_b$ labeling the symbol $s_{b;t,l} \in C$ in the matrix $S_b$.

The receiver 3 comprises an equalizer or detector LMMSE-SIC performing an iterative technique of successively canceling interference, a demodulator DEMOD and a turbo-decoder TURBO-DEC.

For simplification purposes, it is considered that the receiver 3 has a perfect estimate of the channel CHNL (i.e. of the set $\mathcal{H}$) and also of the covariance matrix of the AWGN noise introduced by the channel. Nevertheless, the invention also applies when only an imperfect estimate of the channel is available at the receiver, e.g. based on pilot symbols, or in the case of a semi-blind estimation of the channel.

In known manner, the equalizer LMMSE-SIC is made up of $n_t$ Wiener filters LMMSE1, . . . , LMMSEn$_t$ optimizing the minimum mean square error (MMSE), and acting on each iteration performed by the iterative receiver 3 to estimate the coded symbols transmitted via each transmit antenna of the transmitter 2, on each block of the channel. The notation NSIC designates the number of iterations performed by the receiver 3 for interference cancellation.

The equalizer LMMSE-SIC also has an interference reconstruction module INTERF together with modules 3-1, 3-2, . . . , 3-n$_t$ for subtracting the interference as reconstructed in this way from the signal $Y=\{Y_b\}_{b=1}^{nb}$ received from the channel, and activated on each iteration of the receiver 3. In the presently described implementation, for this purpose, the interference reconstruction module INTERF uses logarithmic a posteriori probability ratios (LAPPRs) on the coded bits delivered by the turbo-decoder TURBO-DEC. As described above, under extreme interference conditions, this leads to better performance than using log extrinsic probability ratios LEXTPRs.

In another implementation of the invention the interference reconstruction module INTERF uses the LEXTPRs delivered by the turbo-decoder TURBO-DEC.

The outputs from the equalizer LMMSE-SIC feed a bank of demodulators DEMOD1, . . . , DEMODn$_t$. The outputs from the demodulators DEMOD1, . . . , DEMOD$_t$ are supplied to a deinterleaver ST-Π$^{-1}$ suitable for performing the operation that is the inverse of the operation performed by the interleaver ST-Π. The output from the deinterleaver ST-Π$^{-1}$ is transmitted to a turbo-decoder TURBO-DEC for decoding.

The turbo-decoder TURBO-DEC is an iterative channel decoder suitable for performing a number NDEC of decoding iterations, where NDEC is greater than or equal to 1. It comprises a first decoder DEC1 having soft inputs and soft outputs (SISO), suitable for decoding the bits coded by the coder RSC1, and a second decoder DEC2 having soft inputs and soft outputs, suitable for decoding the bits coded by the coder RSC2. In this example, the decoders DEC1 and DEC2 perform a BCJR algorithm optimizing the bitwise MAP criterion. Each decoding iteration comprises successively activating the decoder DEC1 and then the decoder DEC2.

Each of the SISO decoders DEC1 and DEC2 takes as input the soft estimates of the demodulated coded bits (including the systematic bits) available at the output from the deinterleaver ST-Π$^{-1}$ and also the logarithmic a priori probability ratios on the information bits.

In the presently described implementation, each SISO decoder outputs the log extrinsic probability ratios LEXTPR on the information bits (i.e. on the systematic bits), and the logarithmic a posteriori probability ratios LAPPR on the coded bits. The way in which the LAPPR and LEXTPR probability ratios are generated by each of these decoders depends on the decoding algorithm implemented by the decoders (in this example the BCJR algorithm). It is itself known and is not described in detail herein.

The LEXTPR probability ratios on the information bits available at the output from the first decoder DEC1 are interleaved using the interleaver Π of the turbo-code and then supplied as input to the second decoder DEC2, as logarithmic a priori probability ratios on the information bits. In similar manner, the LEXTPR probability ratios on the information bits available at the output from the second decoder DEC2 are deinterleaved using the deinterleaver Π$^{-1}$, which performs the operation that is the inverse of the operation performed by the interleaver Π, and they are then supplied as input to the first decoder DEC1. A coding iteration corresponds to decoding by the decoder DEC1 followed by decoding by the decoder DEC2. The LEXTPR probability ratios supplied by the decoder DEC2 to the decoder DEC1 are used by the decoder DEC1 in the following decoding iteration as logarithmic a priori probability ratios on the information bits.

At the end of NDEC turbo decoding iterations, after multiplexing and, where appropriate, after puncturing, the LAPPR probability ratios generated by the turbo-decoder on all of the coded bits (systematic bits and parity bits) are collected together, at the output from the decoder DEC2 for the systematic bits and the parity bits generated by the RSC2 code, and at the output from the decoder DEC1 for the parity bits generated by the RSC1 code.

It should be observed that it is possible, in a variant implementation, to use these LAPPR probability ratios to evaluate LEXTPR probability ratios on all of the coded bits, by subtracting the log intrinsic probability ratios (or observations) from the LAPPR probability ratios.

These LAPPR probability ratios (or in a variant the LEXTPR probability ratios evaluated from the LAPPR probability ratios) are then spatially interleaved using the interleaver ST-II and then used as logarithmic a priori probability ratios for calculating the variance (modules VAR) and the mean (modules AVER) of the transmitted symbols STBICM.

The mean of the transmitted symbols is used to reconstruct the interference by the interference reconstruction module INTERF.

The receiver 3 is thus made up of two nested iterative schemes:
- a so-called "outer" iterative scheme for canceling interference by using NSIC iterations, and for which each outer or global iteration leads to activation of the detector LMMSE-SIC and of the turbo-decoder; and
- a so-called "inner" iterative scheme, specific to the turbo-decoder, using NDEC iterations, and for which each iteration leads to activation of the decoder DEC1 and activation of the decoder DEC2.

Each global iteration can thus comprise one or more inner iterations of the turbo-decoder.

Thus, given the above-described operation, the receiver 3 may be modeled as follows.

Starting from equation (2), the equivalent sliding window discrete base band model used by the equalizer LMMSE-SIC for detecting the symbol $s_{b;t,l}$ in the matrix $S_b$ is written in the form:

$$\underline{y}_{b;l} = \underline{H}_b \underline{s}_{b;l} + \underline{w}_{b;l} \qquad (3)$$

with:
$L_{SW} = L_1 + L_2 + 1$
$\underline{y}_{b;l} = [y_{b;l-L_1}^T, \ldots, y_{b;l+L_2}^T]^T$
$\underline{s}_{b;l} = [s_{b;l-L_1-n_t}^T, \ldots, s_{b;l+L_2}^T]^T$
$\underline{w}_{b;l} = [w_{b;l-L_1}^T, \ldots, w_{b;l+L_2}^T]^T$
$\underline{H}_b$ a Sylvester matrix of dimensions $L_{SW} n_r \times (L_{SW} + n_\tau) n_t$.

Thus, for an index l, the index l' that is used for designating a component of a vector varies from $l-L_1-n_\tau$ to $l+L_2$. The pair of indices (t',l') differs from the pair of indices (t,l) whenever any one of the indices is distinct. Below, the notation $\underline{e}_t$ is used to designate the vector of size $(L_{SW}+n_\tau)n_t$ having a "1" at the position $(L_1+n_\tau+t)$.

In the description below, $\Lambda_{D,DEC} = \{\Lambda_{D,DEC}(c_n)\}_{n=1}^{n_c}$ designates the set of the LAPPR probability ratios on the coded bits available at the output from the decoder TURBO-DEC (i.e. at the output from the decoder DEC2 for the systematic bits and for the parity bits generated by the RSC2 code, and at the output from the decoder DEC1 for the parity bits generated by the RSC1 code) and that are used (after being re-interleaved by the interleaver Π) as a priori information by the detector LMMSE-SIC.

Furthermore, $\{\Lambda_{D,LE}\}_{s_{b;l}}$ and $\{\Lambda_{D,LE}\}_{\underline{s}_{b;l}}$ designate respectively the set of the LAPPR probability ratios on the coded bits involved in labeling $s_{b;t,l}$ and the set of the LAPPR probability ratios on the coded bits involved in labeling $\underline{s}_{b;l}$.

Finally, $\{\Lambda_{D,LE}\}_{\underline{s}_{b;l} \backslash s_{b;t,l}}$ designates the set of the LAPPR probability ratios on the coded bits involved in labeling $\underline{s}_{b;l}$ deprived of the coded bits involved in labeling $s_{b;t,l}$.

Since the following steps are identical for each iteration i=1, . . . , NSIC of the receiver 3, the index designating the current operation is omitted. As mentioned above, it is assumed that the receiver 3 has a perfect estimate of the channel CHNL.

a) Canceling and Regenerating Interference by the Module INTERF:

In order to estimate the symbol $s_{b;t,l}$, a conditional MMSE estimate of the interference needs to be evaluated as follows:

$$\underline{y}_{b;l\backslash t} = E[\underline{y}_{b;l} | \{\Lambda_{D,LE}\}_{\underline{s}_{b;l} \backslash s_{b;t,l}}].$$

In practice, it is not possible to make such an estimate, since the useful components of the signal and the samples of noise are no more independent when they are conditioned relative to $\{\Lambda_{D,LE}\}_{\underline{s}_{b;l} \backslash s_{b;t,l}}$. Two simplifying assumptions can thus be envisaged:

Assumption A1 The probability density $$p_{s_{b;l}, \underline{w}_{b;l} | \{\Lambda_{D,LE}\}_{\underline{s}_{b;l} \backslash s_{b;t,l}}}(s_{b;l}, \underline{w}_{b;l})$$

is factored as follows:

$$p_{s_{b;l}, \underline{w}_{b;l} | \{\Lambda_{D,LE}\}_{\underline{s}_{b;l} \backslash s_{b;t,l}}}(s_{b;l}, \underline{w}_{b;l}) = \qquad (4)$$
$$P(s_{b;t,l}) p_{\underline{w}_{b;l}}(\underline{w}_{b;l}) \prod_{(t',l') \neq (t,l)} P(s_{b;t',l'} | \{\Lambda_{D,LE}\}_{s_{b;t',l'}})$$

Assumption A2 The probability mass function $P(s_{b;t',l'} | \{\Lambda_{D,LE}\}_{s_{b;t',l'}})$ in (4) is proportional to:

$$P(s_{b;t',l'} | \{\Lambda_{D,LE}\}_{s_{b;t',l'}}) \propto e^{\sum_{j=1,\ldots,q} \mu_j^{-1}(s_{b;t',l'}) \Lambda_{D,LE}(d_{b;t',l',j})} \qquad (5)$$

It should be observed that, in practice, assumptions A1 and A2 are not true, even for very long interleaving lengths ($n_c \to \infty$). Nevertheless, they make it possible to obtain an analytical approximation for modeling the behavior of the detector LMMSE-SIC. The MMSE estimate of the interference affecting the symbol $s_{b;t,l}$ then satisfies, under Assumption A1:

$$\underline{y}_{b;l\backslash t} = \underline{H}_b (I_{(L_{SW}+n_\tau)n_t} - \underline{e}_t \underline{e}_t^\dagger) \underline{m}_{b;l} \qquad (6)$$

where $\underline{m}_{b;l}$ is the vector of the estimated symbols $m_{b;t',l'} = E[s_{b;t',l'} | \{\Lambda_{D,LE}\}_{s_{b;t',l'}}]$ evaluated while taking account of Assumption A2.

This interference is subtracted for each transmitter antenna t by the module 3-t of the receiver 3 from the matrix $\underline{y}_{b;l}$. The new vector of observations to be taken into account for the following iteration of the receiver 3 is then: $\underline{y}_{b;l} \ominus \underline{y}_{b;l} - \underline{y}\underline{y}_{b;l\backslash t}$ (or in equivalent manner, if i designates the current iteration of the detector LMMSE-SIC: $\underline{y}_{b;l}^{(i)} = \underline{y}_{b;l}^{(i-1)} - \underline{y}_{b;l\backslash t}^{(i-1)}$).

b) LMMSE Estimation by the Modules LMMSE1, . . . , LMMSE$n_t$:

The theoretical problem to be solved by the detector LMMSE-SIC is to find the estimated symbol $\check{s}_{b;t,l} = \underline{f}_{b;t}^\dagger (\underline{y}_{b;l} - \underline{y}_{b;l\backslash t})$ that minimizes the mean square error $E[|\check{s}_{b;t,l} - s_{b;t,l}|^2|]$ defined by:

$$E[E[|\check{s}_{b;t,l} - s_{b;t,l}|^2 | \{\Lambda_{D,LE}\}_{\underline{s}_{b;l} \backslash s_{b;t,l}}]] \qquad (7)$$

The outer mathematical expectation in equation (7) makes the LMMSE filter $\underline{f}_{b;t}$ time invariant, with:

$$\underline{f}_{b;t} = \underline{\Xi}_{b;t}^{-1} \underline{\xi}_{b;t}$$

where:

$$\xi_{b;t}=E[\underline{\xi}_{b;t,l}] \text{ with } \underline{\xi}_{b;t,l}=E[(\underline{y}_{b;t}-\underline{y}_{b;l\setminus t})s_{b;t,l}^*|\{\Lambda_{D,LE}\}_{s_{b;t}\setminus s_{b;t,l}}] \quad (8)$$

and $$\Xi_{b;t}=E[\underline{\Xi}_{b;t,l}] \text{ with } \underline{\Xi}_{b;t,l}=E[(\underline{y}_{b;t}-\underline{y}_{b;l\setminus t})(\underline{y}_{b;t}-\underline{y}_{b;l\setminus t})^\dagger|\{\Lambda_{D,LE}\}_{s_{b;t,l}}] \quad (9)$$

In practice, it is not possible to calculate $\underline{f}_{b;t}$ in the manner described above.

Nevertheless, under Assumption A1, $\xi_{b;t}$ and $\Xi_{b;t}$ become:

$$\xi_{b;t}=\underline{h}_{b;t}=\underline{H}_b\underline{e}_t \text{ and } \Xi_{b;t}=\underline{H}_b\underline{V}_{b\setminus t}\underline{H}_b^\dagger+\tau_w^2 I_{L_{SW}n_r}$$

where $\underline{V}_{b\setminus t}$ designates the unconditional covariance matrix of the symbols defined by:

$$\underline{V}_{b\setminus t}I_{(L_{SW}+n_t)}\otimes \text{diag}\{v_{b;1},\ldots,v_{b;t-1},1,v_{b;t+1},\ldots,v_{b;n_t}\} \quad (10)$$

where diag designates the diagonal matrix having as its diagonal elements the elements specified between braces, where $v_{b;t',l}=E[v_{b;t',l}]$ and $v_{b;t',l}=E[|s_{b;t',l}-m_{b;t',l}|^2|\{\Lambda_{D,LE}\}_{s_{b;t',l}}]$ are evaluated under Assumption A2, $\forall t'\neq t$.

This produces the following filter:

$$\underline{f}_{b;t} = \frac{1}{1+\eta_{b;t}(1-v_{b;t})}\Sigma_b^{-1}\underline{h}_{b;t} \quad (11)$$

with $\underline{\Sigma}_b=\underline{H}_b\underline{V}_b\underline{H}_b^\dagger+\sigma_w^2 I_{L_{SW}n_r}$, $\eta_{b;t}=\underline{h}_{b;t}^\dagger\Sigma_b^{-1}\underline{h}_{b;t}$; and $$\underline{V}_b=\underline{V}_{b\setminus t}-(1-v_{b;t})\underline{e}_t\underline{e}_t^\dagger \quad (12)$$

where $v_{b;t}=E[v_{b;t,l}]$ with $v_{b;t,l}E[|s_{b;t,l}-m_{b;t,l}|^2|\{\Lambda_{D,LE}\}_{s_{b;t,l}}]$ evaluated under Assumption A2.

The estimate $\hat{s}_{b;t,l}$ of $s_{b;t,l}$ is then expressed in the following form:

$$\hat{s}_{b;t,l}=\underline{f}_{b;t}^\dagger(\underline{y}_{b;t}-\underline{y}_{b;l\setminus t})=g_{b;t}s_{b;t,l}+\zeta_{b;t,l} \quad (13)$$

with $g_{b;t}=\underline{f}_{b;t}^{554}\underline{h}_{b;t}$, and where $\zeta_{b;t,l}$ designates the interference and residual noise term.

Under Assumption A1, $\zeta_{b;t,l}$ in equation (13) is of zero mean and is not correlated with the useful signal $s_{b;t,l}$, i.e., $E[s_{b;t,l}\zeta_{b;t,l}^*]=0$. Its variance is given by $\zeta_{b;t}=g_{b;t}(1-g_{b;t})$.

As a result, it is possible to define an unconditional signal to interference plus noise ratio as follows:

$$\gamma_{b;t} = \frac{g_{b;t}}{1-g_{b;t}} = \frac{\eta_{b;t}}{1-v_{b;t}\eta_{b;t}} \quad (14)$$

for each channel block and for each transmit antenna of the transmitter 2. This ratio $\gamma_{b;t}$ models the behavior of the Wiener filter LMMSEt of the detector LMMSE-SIC of the receiver 3.

At this point, we introduce two new assumptions A3 and A4 for implementing and modeling the detector LMMSE-SIC, namely:

Assumption A3 Replace the statistical mean by an empirical mean, i.e.:

$$\forall b, \forall t, v_{b;t} \approx \tilde{v}_{b;t} = \frac{1}{n_s}\sum_{l=1}^{n_s} v_{b;t,l} \quad (15)$$

where this assumption is valid when $n_s$ is very large.

Assumption A4 The variance is identical regardless of the fading block b and the transmitter antenna t under consideration, in other words:

$$\forall b, \forall t, v_{b;t} \approx v = \frac{1}{n_b n_t}\sum_{b=1}^{n_b}\sum_{t=1}^{n_t} v_{b;t} \quad (16)$$

In practice, this assumption A4 is not valid, even for very long interleaving lengths. Nevertheless, the inventors have found that this assumption does not lead to degradation of the performance of the detector LMMSE-SIC.

Under the assumptions A3 and A4, the covariance matrix $\underline{V}_b$ of the estimated symbols can be written in the following simplified form:

$$\underline{V}=\tilde{v}I_{(L_{SW}+n_t)n_t} \quad (17)$$

where:

$$\tilde{v} = \frac{1}{n_b n_t}\sum_{b=1}^{n_b}\sum_{t=1}^{n_t}\tilde{v}_{b;t} \quad (18)$$

c) Demodulation by the Demodulator DEMOD and Decoding by the Turbo-Decoder TURBO-DEC The symbols $\hat{s}_{b;t,l}$ estimated by the equalizer LMMSE-SIC are used as decision statistics by the demodulator DEMOD for calculating the log extrinsic probability ratios LEXTPR written $\{\Lambda_{E,DEM}(d_{b;t,l,j})\}_{j=1}^q$.

For this purpose, the following assumption is envisaged:

Assumption A5: In (13), the probability density $p_{\hat{s}_{b;t,l}|s_{b;t,l}}(\hat{s}_{b;t,l})$ is $N_C(g_{b;t}s_{b;t,l}, \zeta_{b;t})$ Under the assumptions A2 and A5, and when using Gray labeling, the LEXTPR $\Lambda_{E,DEM}(d_{b;t,l,j})$ of the bit labeled by $d_{b;t,l,j}$ is expressed in the following form:

$$\Lambda_{E,DEM}(d_{b;t,l,j}) = \frac{\sum_{s\in C_j^{(1)}} e^{-|\hat{s}_{b;t,l}-g_{b;t}s|^2/\zeta_{b;t}}}{\sum_{s\in C_j^{(0)}} e^{-|\hat{s}_{b;t,l}-g_{b;t}s|^2/\zeta_{b;t}}} \quad (19)$$

The LEXTPRs, which form a set $\Lambda_{E,DEM}$, are then deinterleaved so as to form a set $\Lambda_{I,DEC}=\{\Lambda_{I,DEC}(c_n)\}_{n=1}^{n_c}$ of log intrinsic probability ratios used as observations by the turbo-decoder TURBO-DEC.

The following assumption is then used for decoding:

Assumption A6 The probability density $p_{\Lambda_{I,DEC}|c}(\Lambda_{I,DEC})$ is factored as follows:

$$p_{\Lambda_{I,DEC}|c}(\Lambda_{I,DEC}) = \prod_{n=1}^{n_c} p_{\Lambda_{I,DEC}(c_n)|c_n}(\Lambda_{I,DEC}(c_n)) \quad (20)$$

This assumption is true for an interleaver of length that is finite but long. It makes it possible to simplify the task of decoding.

Under Assumption A6, the turbo-decoder TURBO-DEC evaluates the new LAPPR $\Lambda_{D,DEC}=\{\Lambda_{D,DEC}(c_n)\}_{n=1}^{n_c}$ on the coded bits for the following iteration of the iterative receiver.

These LAPPRs are interleaved by the interleaver ST-II, thus forming a set $\Lambda_{D,LE}$ of LAPPRs. Then the means of the transmitted symbols conditioned to these LAPPRs are evaluated by the modules AVER of the receiver 3 for each transmit antenna by virtue of the assumptions A1 and A2, and the variance of the transmitted symbols conditioned to these LAPPRs is evaluated by the module VAR of the receiver 3 for the set of antennas, by virtue of the assumptions A1, A2, and A4.

The variance is supplied to each detector LMMSE1, . . . , LMMSEn$_t$ in order to be used during the following iteration, while the means are supplied to the interference reconstruction module INTERF.

As mentioned above, each of the two decoders DEC1 and DEC2 of the turbo-decoder TURBO-DEC implements the BCJR algorithm and they interchange probabilistic quantities (i.e. log likelihood ratios in the presently described implementation).

More precisely, the first decoder DEC1 calculates the LAPPRs on the bits coded by the RSC1 code (information and parity bits), by taking account of the observations $\Lambda_{I,DEC} = \{\Lambda_{I,DEC}(c_n)\}_{n=1}^{n_c}$ supplied by the demodulator DEMOD and the logarithmic a priori probability ratios available at its input about the systematic information bits. These logarithmic a priori probability ratios correspond to the information $\Lambda_{A,DEC} = \{\Lambda_{A,DEC}(u_n)\}_{n=1}^{n_d}$ stored during a preceding activation of the turbo-decoder (specifically the most recent LEXTPRs on the systematic bits supplied by the second decoder DEC2).

The second decoder DEC2 is then activated and calculates the LAPPRs on the bits coded by the RSC2 code (systematic information bits and parity bits), while taking account of the observations $\Lambda_{I,DEC} = \{\Lambda_{I,DEC}(c_n)\}_{n=1}^{n_c}$ and the logarithmic a priori probability ratios available at its input about the systematic information bits and supplied by the first decoder DEC1 (these are the LEXTPRs on the systematic bits evaluated by the first decoder DEC1, as mentioned above).

The inventors have found that a passage through the equalizer LMMSE-SIC followed by a passage through the first decoder DEC1 and a passage through the second decoder DEC2 (i.e. performing a single decoding iteration by the decoder TURBO-DEC, i.e. NDEC=1) leads to better performance for a sufficient number of global iterations of the receiver 3 than does an scheduling scheme in which it is envisaged using a passage through the equalizer LMMSE-SIC followed by a determined number of iterations NDEC>1 of the turbo-decoder. It should nevertheless be observed that a degradation in performance can be seen when using modulation and coding schemes of low rate.

In accordance with the invention, the receiver 3 also has a predictor device 4 for predicting the performance of the system 1 of the invention. The predictor device 4 relies on three functional modules 4A, 4B, and 4C, shown diagrammatically in FIG. 5.

More precisely, the predictor device 4 comprises a first modeling module 4A that is suitable for modeling the behavior of the above-described equalizer LMMSE-SIC, and a second modeling module 4B that is suitable for modeling the behavior of the demodulator DEMOD and of the turbo-decoder TURBO-DEC. The modules 4A and 4B are activated by an activation module 4C in order to predict the performance of the system 1 for each iteration of the iterative receiver 3.

In the presently described implementation, the functional modules 4A, 4B, and 4C are in the form of software instructions. They are described in greater detail below with reference to FIG. 7.

Figure 6:
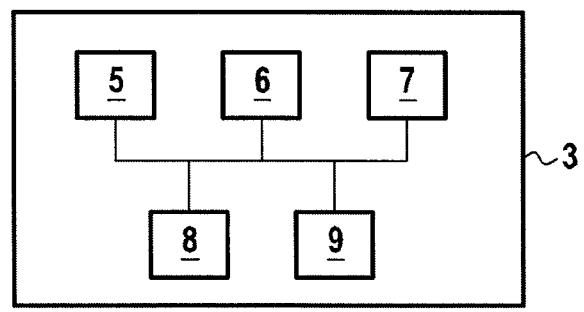
FIG. 6 shows, in diagrammatic form, the hardware architecture of the FIG. 2 receiver.

In the presently described implementation, the receiver 3 has the hardware architecture of a computer, as shown diagrammatically in FIG. 6.

In particular, it comprises a processor 5, a ROM 6, a random access memory (RAM) 7, a nonvolatile memory 8, and communication means 9 for communicating over the network NW, enabling it in particular to communicate with the transmitter 2.

Figure 7:
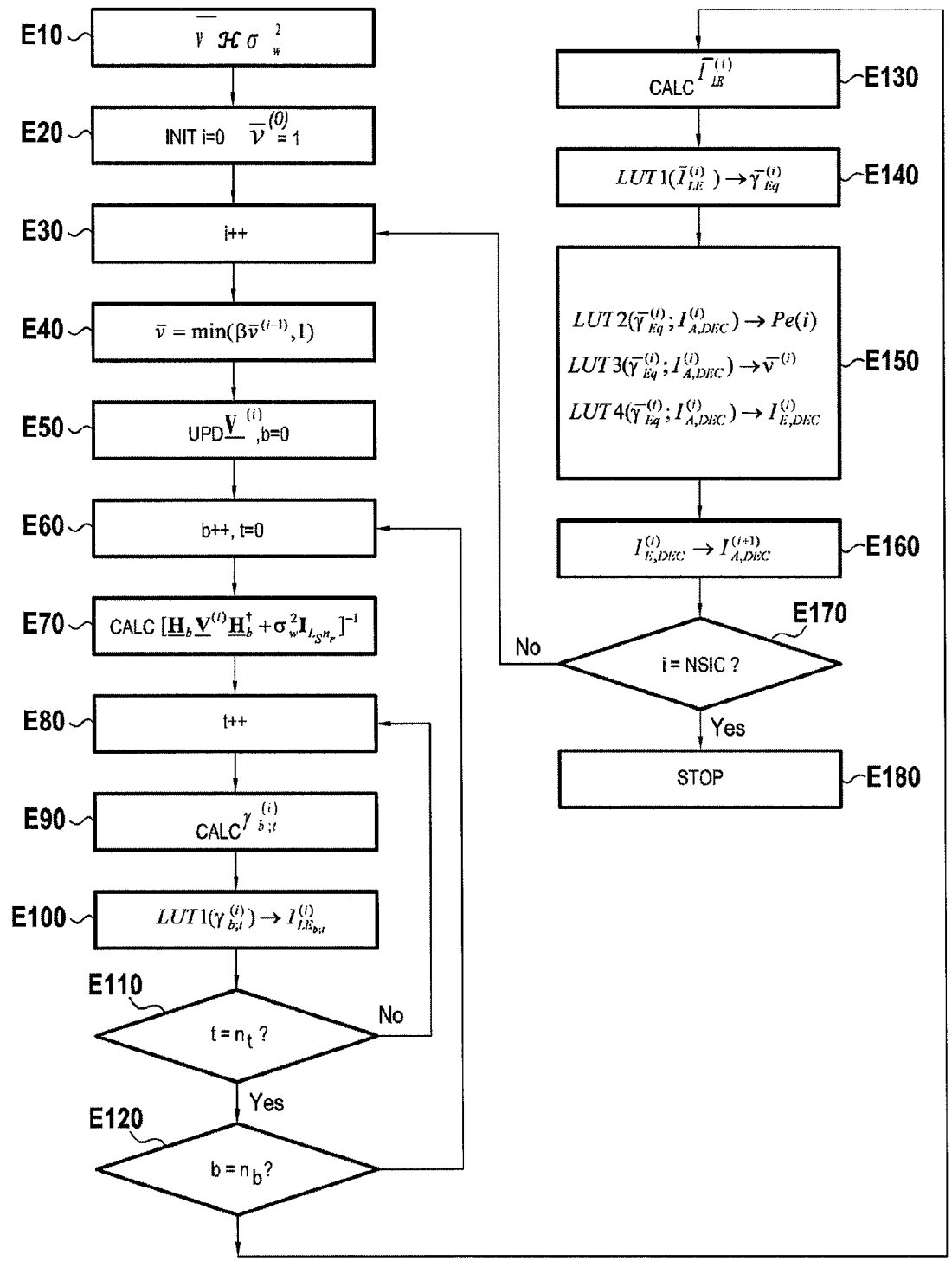
FIG. 7 shows, in the form of a flowchart, the main steps of a prediction method of the invention in a particular implementation in which it is performed by the FIG. 4 predictor device.

The ROM 6 of the receiver 3 constitutes a data medium in accordance with the invention, that is readable by the processor 5 and that stores a computer program in accordance with the invention, including instructions for executing steps of a prediction method in accordance with the invention, as described below with reference to FIG. 5 and to FIG. 7, in a particular implementation. This computer program defines, in equivalent manner, the functional modules 4A, 4B, and 4C of the predictor device 4 of the invention and the interactions between them.

As mentioned above, the invention makes it possible in reliable and rapid manner to predict the performance of the communication system 1 over the transmission channel CHNL. It relies, for this purpose, on modeling the physical layer of the system 1, and more specifically the behavior of the receiver 3 and of the entities that make it up, namely the equalizer LMMSE-SIC, the demodulator DEMOD, and the turbo-decoder TURBO-DEC.

It can clearly be seen, in the light of the above description of the way in which the iterative receiver 3 operates, that it is defined as a non-linear dynamic system that is particularly complicated. The invention seeks to analyze how that dynamic system varies over its iterations, in order to be able to predict its performance.

For this purpose, in the presently described implementation, the prediction method of the invention makes use of a semi-analytic approach to characterize the behavior of the equalizer LMMSE-SIC at each iteration performed by the receiver 3, and also a stochastic approach in order to characterize the behavior of the demodulator DEMOD and of the turbo-decoder TURBO-DEC. This approach is performed for each iteration of the iterative receiver 3, in other words for i=1, . . . , NSIC. It relies on the above-described simplifying assumptions A1 to A6.

Notation similar to that described above for describing the operation of the system 1 is used below in the description in order to visualize more easily the correspondence between the models proposed by the invention and the various variables that are manipulated by the entities of the receiver 3.

The performance prediction performed by the predictor device 4 relies on various pieces of information available in the receiver 3 or estimated thereby, namely the estimate of the channel CHNL (in other words the set $\mathcal{H}$ of the $n_b$ finite impulse responses $H_b(l)$, b=1, . . . , $n_b$ modeling the rapid variations of the channel over each block), an estimate $\sigma_w^2$ of the variance of the AWGN noise, and an estimate $\bar{v}$ of the variance of the coded symbols of the STBICM modulation of the transmitter 2 (step E10). The ways in which this information can be determined or obtained by the receiver 3 are known to the person skilled in the art and are not described in greater detail herein.

The various variables used by the predictor device 4 when predicting are initialized (step E20). Among these variables, there can be found in particular the index i of the current iteration of the iterative receiver 3 under consideration (initialized to 0) and the estimate of the variance of the coded symbols at the input to the equalizer (initialized to $\overline{v}^{(0)} = \overline{v} = 1$ under the assumption of normalized power for the coded symbols).

Once this initialization has been performed, the device 4 increments the index i of the current iteration of the receiver 3 (step E30).

For generalization purposes, the description below relates to an arbitrary iteration i of the iterative receiver 3.

The prediction of the performance of the system 1 at iteration i relies on two successive stages of modeling that are performed respectively by the first modeling module 4A and by the second modeling module 4B of the predictor device 4.

During the first stage, the module 4A of the device 4 models the behavior of the equalizer LMMSE-SIC by assuming that the $n_t \times n_b$ outputs supplied by the equalizer LMMSE-SIC are $n_t \times n_b$ parallel and independent AWGN channels, each channel being characterized by an SINR written $\gamma_{b;t}^{(i)}$. The module 4A then uses the metric MIESM, to evaluate and SINR $\overline{\gamma}_{Eq}^{(i)}$ of an AWGN channel equivalent to those parallel channels and having the same mean mutual information.

In order to estimate this SINR $\overline{\gamma}_{Eq}^{(i)}$, the module 4A begins by updating the value of the estimate $\overline{v}$ of the variance of the coded symbols available at the input to the equalizer (step E40), using the following equation:

$$\overline{v} = \min(\beta \overline{v}^{(i-1)}, 1) \quad (21)$$

where $\beta$ designates a weighting factor and $\overline{v}^{(i-1)}$ an estimate of the variance of the coded symbols determined during the preceding iteration i–1 by the modeling module 4B. This step is described in greater detail below.

Thereafter, the module 4A updates a covariance matrix $\underline{V}^{(i)}$ of the estimated symbols available at the input to the detector LMMSE-SIC in compliance with above-described equation (17), using a new value of $\tilde{v}$ (i.e. by giving the value $\overline{v}$ to the variable $\tilde{v}$ in equation (17)) (step E50).

The module 4A also initializes an internal variable b to 0 for the purpose of scanning all of the blocks of the channel CHNL. This variable is then incremented for each new block taken into consideration (step E60) upto $n_b$. During this step, an internal variable t for indexing the transmit antennas is also initialized to 0.

For each block indexed by b, the module 4A calculates the following quantity (step E70):

$$[\underline{H}_b \underline{V}^{(i)} \underline{H}_b^\dagger + \sigma_w^2 I_{Ls n_r}]_{-1}$$

from the estimates $\hat{\mathcal{H}}$ of the channel and $\sigma_w^2$ of the variance of the noise that are available thereto.

Figure 5:
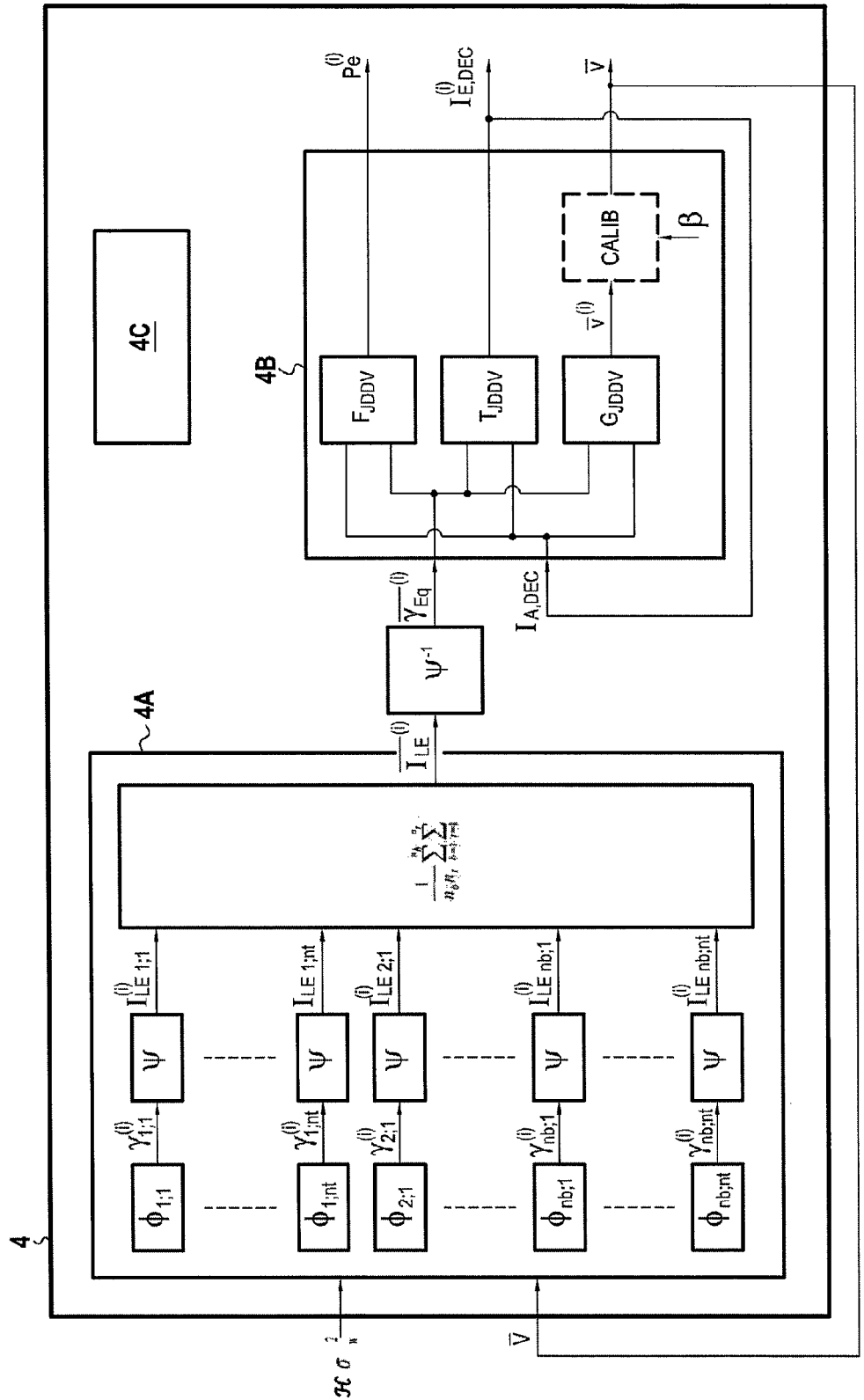
FIG. 5 shows the functional architecture of the FIG. 2 predictor device.

Thereafter, for each transmit antenna indexed by t, $t = 1, \ldots, n_t$ (step E80), the module 4A estimates a signal to interference plus noise ratio $\gamma_{b;t}^{(i)}$ at the output from the equalizer LMMSE-SIC for the block b and for the antenna t using the expression (14), in which $v_{b;t}$ is replaced by $\overline{v}$ in application of assumption A4 (step E90, modeled by the application of functions $\phi_{1,1} \ldots, \phi_{nb,nt}$ shown in FIG. 5).

Thereafter, the module 4A uses this SINR $\gamma_{b;t}^{(i)}$ to estimate the mean mutual information $I_{LE_{b;t}}^{(i)}$ of an equivalent AWGN channel with $1\gamma_{b;t}^{(i)}$ noise variance (under the assumption of a normalized power for the coded symbols) (step E100). More precisely, $I_{LE_{b;t}}^{(i)}$ designates the mean mutual information between the discrete input $s_{b;t,l} \in C$ of the channel and its output $\tilde{s}b;t,l = s_{b;t,l} + \epsilon_{b;t,l}$, with $\epsilon_{b;t,l}$ of Gaussian distribution $N_C(0, 1/\gamma_{b;t})$.

In manner known to the person skilled in the art, the mutual information for an AWGN channel and for independent inputs that are identically and uniformly distributed and selected from a finite constellation A of cardinal number $2^q$ is given by:

$$I_A(\gamma) = I(z; y) = q - \frac{1}{2^q} \sum_{x \in A} \int_y P(y \mid x) \left[ \log_2 \frac{\sum_{x' \in A} P(y \mid x')}{P(y \mid x)} \right]$$

where z is a random variable describing the transmitted inputs, y is a random variable describing the corresponding received signal at the output from the AWGN channel, and $P(y/z) = N_c(z, 1/\gamma)$ is the transition probability of the underlying Gaussian channel for which the SNR is $\gamma$.

The value $I_{LE_{b;t}}^{(i)}$ depends on a single parameter, namely the SINR $\gamma_{b;t}^{(i)}$, in other words:

$$I_{LE_{b;t}}^{(i)} = \psi(\gamma_{b;t}^{(i)}) \quad (22)$$

where $\psi$ designates an increasing monotonic function, i.e. a function that is invertible, and that depends on the MCS used by the transmitter 2. It should be observed that this scheme is known to the receiver, either because the transmitter 2 uses a single MCS, or else, when link adaptation is performed, because the scheme is identified from a quality metric of the channel as evaluated by the receiver, as mentioned above.

In the presently described implementation, the function $\psi$ is stored in the nonvolatile memory 8 of the predictor device 4 in the form of a preestablished correspondence table LUT1. If a plurality of MCSs can be used by the transmitter, then a correspondence table LUT1 is stored for each MCS.

Such a correspondence table can easily be established by Monte Carlo simulation, in manner known to the person skilled in the art.

In another implementation, it is possible to use an analytic form of the function $\psi$.

The steps E60 to E100 are repeated so long as the index t is less than the number of transmit antennas $n_t$ (step E110) and the index b is less than the number of blocks $n_b$ of the channel (step E120).

The module 4A then evaluates the arithmetic mean $\overline{I}_{LE}^{(i)}$ of the mean mutual information $I_{LE_{b;t}}^{(i)}$ as estimated in this way for each block b and for each transmit antennas t (step E130). In other words;

$$\overline{I}_{LE}^{(i)} = \frac{1}{n_b n_t} \sum_{b=1}^{n_b} \sum_{t=1}^{n_t} I_{LE_{b;t}} \quad (23)$$

Then, using the value $\overline{I}_{LE}^{(i)}$, it determines the corresponding SINR $\overline{\gamma}_{Eq}^{(i)}$ by applying the function that is the inverse of $\psi$ (step E140), i.e.:

$$\overline{\gamma}_{Eq}^{(i)} = \psi^{-1}(\overline{I}_{LE}^{(i)}) = \psi^{-1}\left( \frac{1}{n_b n_t} \sum_{b=1}^{n_b} \sum_{t=1}^{n_t} I_{LE_{b;t}} \right) \quad (24)$$

In other words, the SINR $\overline{\gamma}_{Eq}^{(i)}$ is an SINR that has been compressed using the metric MIESM on the basis of the SINRs $\gamma_{b;t}^{(i)}$.

In order to determine $\overline{\gamma}_{Eq}^{(i)}$, in this example the module 4A makes use once more of the correspondence table LUT1.

The SINR $\overline{\gamma}_{Eq}^{(i)}$ as determined in this way by the module 4A during this first modeling stage is transmitted to the second modeling module 4B, which begins the second joint modeling stage of the operation of the demodulator DEMOD and of the turbo-decoder TURBO-DEC.

More precisely, during the second stage of modeling, and with reference to FIG. 5, the module 4B models the demodulation performed by DEMOD, the interleaving performed by ST-$\Pi^{-1}$, the turbo decoding performed by TURBO-DEC (a pass via DEC1 followed by a pass via DEC2), the re-interleaving by ST-$\Pi$, and the calculation of the mean and the variance of the transmitted symbols from the LAPPRs available at the output of TURBO-DEC from the respective blocks AVER and VAR of the receiver 3 in order to reconstruct the interference.

Thereafter, in accordance with the invention, and on the basis of this modeling, it determines, for the current iteration i of the iterative receiver, transmission error probabilities $P_e(i)$ on the channel CHNL, an estimate of the variance $\bar{v}_i$ of the coded symbols at the output from the decoder TURBO-DEC, and mean mutual information $I_{E,DEC}^{(i)}$ between the information bits and the LEXTPRs associated with the information bits and available at the output from the decoder TURBO-DEC (step E150).

In this example, the error probability $P_e(i)$ is an error probability per transmitted block. In a variant, it may be an error probability per bit.

The modeling performed by the module 4B relies on preestablished two-dimensional functions stored in the form of three three-dimensional correspondence tables LUT2, LUT3, and LUT4 in the nonvolatile memory 8 of the predictor device 4, and that characterize the joint behavior of the demodulator and of the turbo-decoder TURBO-DEC for determining the error probabilities $P_e(i)$ and the mean mutual information $I_{E,DEC}^{(i)}$, and also the behavior of the interleaver ST-$\Pi$ and of the module VAR for determining the variance $\bar{v}_i$.

More specifically, the functions stored in these correspondence tables depend on two parameters, namely firstly the SINR $\bar{\gamma}_{Eq}^{(i)}$ evaluated by the module 4A, and secondly the mean mutual information $I_{A,DEC}^{(i)}$ between the information bits sent by the source SRC and the logarithmic a priori probability ratios available at the input of the turbo-decoder TURBO-DEC at iteration i.

These correspondence tables are generated by simulation. Naturally, they depend on the STBICM applied on transmission. Also, if a plurality of MCSs can be used by the transmitter, then a correspondence table LUT2, LUT3, and LUT4 is stored for each MCS.

In the presently described implementation, the simulations making it possible to generate the tables LUT2, LUT3, and LUT4 consist firstly in modeling the calculation performed by the demodulator DEMOD via equation (19) from the SNIR $\bar{\gamma}_{Eq}^{(i)}$, and secondly in modeling the variation in the mean mutual information of the LEXTPRs supplied by the turbo-decoder TURBO-DEC (or in equivalent manner the mean mutual information of the logarithmic a priori probability ratios available at the input to the turbo-decoder).

Appendix 1 summarizes in syntax form of the main steps performed during simulation in order to obtain the above-mentioned correspondence tables.

For each envisaged MCS, this simulation results in generating three three-dimensional correspondence tables LUT2, LUT3, and LUT4. Thus, contrary to document D1, even for Gray labeling, joint modeling of the demodulator and of the turbo-decoder of the invention is performed using functions having two input variables, namely the ratio of signal to interference plus noise $\bar{\gamma}_{Eq}^{(i)}$ and the mean mutual information relating to the a priori probability ratios concerning the information bits generated by the source SRC.

It should be observed that in the presently described implementation, and as shown in appendix 1, the correspondence tables LUT2, LUT3, and LUT4 are generated after the decoder TURBO-DEC has performed a single decoding iteration.

Nevertheless, in a variant, it is possible to envisage generating such tables in similar manner while simulating some number NDEC>1 of decoding iterations.

In order to model the exchanges between the equalizer LMMSE-SIC and the turbo-decoder TURBO-DEC (via the demodulator DEMOD), the module 4C updates the mutual information $I_{A,DEC}^{(i)}$ for iteration i with the value $I_{E,DEC}^{(i)}$ from the table LUT2 (step E160).

Then, so long as the index i is less than the number of iterations NSIC of the receiver 3 (response "yes" to the test E170), the steps E30 to E160 are reiterated. In particular, the variance $\bar{v}_i$ determined in step i is used during the step i+1 to evaluate the estimate of the variance $\bar{v}$ of the coded symbols available at the input to the equalizer LMMSE-SIC in accordance with equation (21) (step E40).

In the presently described implementation, in order to estimate the variance $\bar{v}$ at iteration i+1, a weighting factor $\beta$ is applied in accordance with equation (21) to the variance $\bar{v}_i$ determined on iteration i.

In this example, this factor serves to take account of the fact that when use is made of a decoder LMMSE-SIC based on the LAPPRs delivered by the turbo-decoder, even for interleaving a channel of infinite size, assumptions A1, A2, and A4 are not valid.

Consequently, the Wiener filters $\{f_{b;t}\}$ and the SINRs $\{\gamma_{b;t}\}$ at the outputs from those filters used by the equalizer LMMSE-SIC are only approximations, and in practice they differ slightly from the quantities calculated for generating the correspondence tables LUT1, LUT2, and LUT3. The SINRs that are in fact available at the output from the equalizer LMMSE-SIC are in practice smaller than those used for estimating the correspondence tables.

Furthermore, the empirical variance $\bar{v}$ used in the receiver 3 does not coincide with the variance read from the table LUT3 by the second modeling module 4B during prediction if $n_s$ is too small. These inaccuracy factors and the prediction errors that stem from them accumulate with increasing number of iterations of the iterative receiver, such that the inventors have found that in the absence of correcting the variance $\bar{v}_i$ extracted from the table LUT3 at iteration i prior to using it for the following iteration i+1, the predicted error probability is too optimistic compared with the error probability that would be obtained by simulating the system 1.

In order to solve this problem, simple but effective calibration of the variance $\bar{v}_i$ is performed in the presently described implementation. This calibration consists in correcting the value of $\bar{v}_i$ by the weighting factor $\beta$. More specifically, in step E40, as mentioned above, $\bar{v}$ is taken to be equal to $\min(\beta\bar{v}^{(i)}, 1)$.

By means of exhaustive simulations, the inventors have found that the weighting factor $\beta$ that needs to be applied depends on the MCS under consideration, but does not vary significantly as a function of the number of transmit and receive antennas nor as a function of the characteristics of the channel (i.e. time and/or frequency selectivity).

As mentioned above, this weighting factor seeks to reduce the difference between the error probability predicted by the predictor device 4, for each implementation of the channel and for each iteration i>1 of the iterative receiver, and an error probability obtained by simulation of the communication system 1, e.g. by means of a Monte Carlo simulation, averaged over a variety of data and implementations of the transmission channel.

For this purpose, various criteria can be used for determining the weighting factor $\beta$.

To illustrate these criteria, each realisation of the transmission channel is given an index $k, k \in \mathbb{N}$, and the error probability per block obtained by simulation of the system 1 on the transmission channel CHNL is written $\overline{P}_e^{(i)}(k)$, and the error probability predicted by the device 4 for the realisation of the channel k at iteration i is written $P_e^{(i)}(\beta,k)$. Appendix 2 briefly summarizes the main steps performed during simulation of the system 1.

A first criterion consists in determining the weighting factor that, over all of the iterations performed by the iterative receiver 3 and over a large number K of realisations of the transmission channel, minimizes the sum of the distances between the error probabilities $P_e^{(i)}(\beta,k)$ estimated by the module 4B and the error probability $\overline{P}_e^{(i)}(k)$. In other words, in accordance with this first criterion, the following weighting factor is selected:

$$\beta_1 = \arg\min_{\beta} \sum_{k=1}^{K} \sum_{i=2}^{NSIC} D(\overline{P}_e^{(i)}(k), P_e^{(i)}(\beta, k)) \quad (24)$$

where $D(x, y)=|10 \log_{10}(x)-10 \log_{10}(y)|^2$, for example.

A second criterion consists in selecting the weighting factor that minimizes the sum over a large number K of realisations of the transmission channel, of the distances between the error probability $P_e^{(i0)}(\beta,k)$ estimated by the module 4B and the error probability $\overline{P}_e^{(i0)}(\beta,k)$ obtained by simulating the performance of the transmission system 1 at an iteration $i0 \in \{2, \ldots, NSIC\}$ determined by the iterative receiver 3, i.e.:

$$\beta_2 = \arg\min_{\beta} \sum_{k=1}^{K} D(\overline{P}_e^{(i0)}(k), P_e^{(i0)}(\beta, k)) \quad (25)$$

Figure 8:
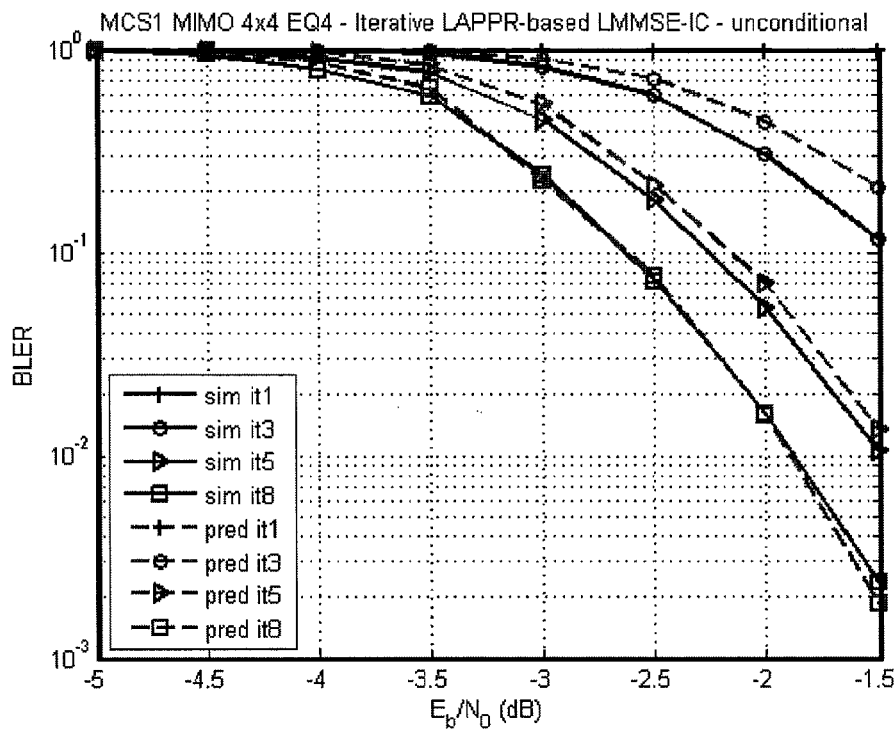
FIGS. 8 and 9 show experimental validation of the prediction method of the invention for two distinct modulation and coding schemes.
Figure 9:
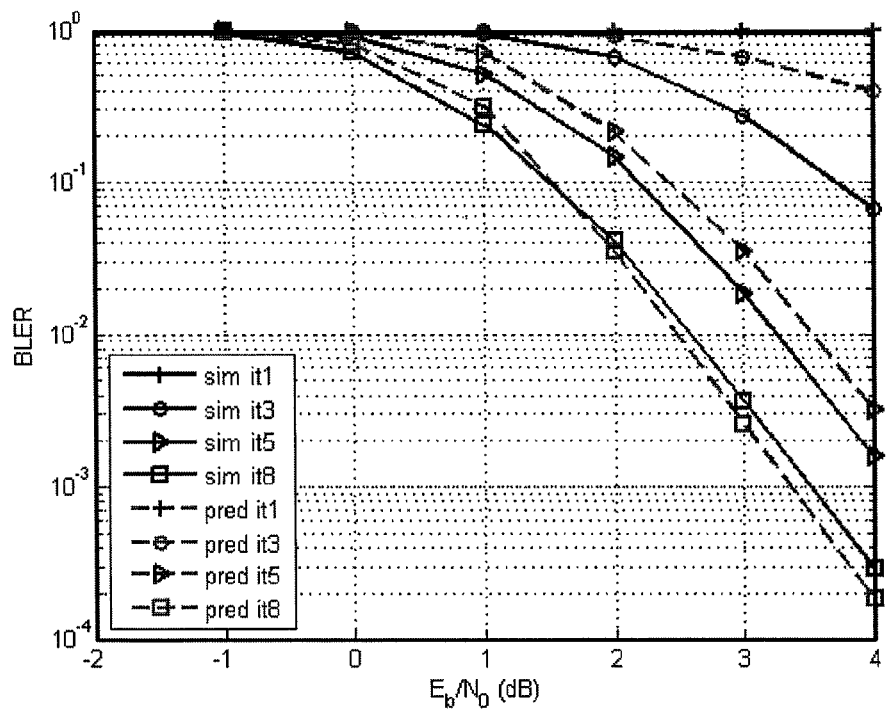

FIGS. 8 and 9 show experimental validations of the prediction method of the invention, for two modulation and coding schemes MCS1 and MCS2, respectively.

The modulation and coding scheme MCS1 used by the transmitter 2 is a bit interleaved coded modulation (BICM) based on a turbo-code TC with a coding rate ½, based on two recursive systematic convolutional encoders RSC1 and RSC2 having 4 states, of coding rate ½ and of generator polynomials (1,5/7) (in octal representation). The outputs from the turbo-code TC are punctured with a regular pattern and the interleaver Π is a pseudorandom interleaver. The scheme MCS1 also relies on quadrature phase shift keying (QPSK) or QPSK modulation with Gray labeling. The spectral efficiency is 1 bit per complex spatial dimension.

The modulation and coding scheme MCS2 used by the transmitter 2 is a bit interleaved coded modulation (BICM) based on a turbo-code TC with a coding rate ½, based on two recursive systematic convolutional encoders RSC1 and RSC2 having 4 states, of coding rate ½ and of generator polynomials (1,5/7) (in octal representation). The outputs from the turbo-code TC are punctured with a regular pattern and the interleaver Π is a pseudorandom interleaver. The scheme MCS2 also relies on quadrature amplitude modulation QAM-16 with Gray labeling. The spectral efficiency is 2 bits per complex spatial dimension.

Transmission takes place over a MIMO channel having $n_t=4$ transmit antennas and $n_r=4$ receive antennas, with quasi static Rayleigh fading (i.e. number of blocks $n_b=1$), and that is frequency selective, with 4 equal-energy paths ($n_\tau=3$). Transmission duration was set at $n_s=288$ channel uses, which corresponds to 1152 information bits and 2304 coded bits (after puncturing) for the scheme MCS1 and to 2304 information bits and 4608 coded bits (after puncturing) for the scheme MCS2.

On reception, consideration was given to an iterative algorithm of the LMMSE-IC type based on the LAPPRs. The number of iterations performed by the iterative receiver 3 was set at NSIC=8, which suffices in practice to ensure convergence. The length of the sliding window was equal to $L_{SW}=17$ ($L_1=L_2=8$). On each iteration of the iterative receiver 3, the symbol variance was calibrated by a weighting factor $\beta_i$ selected using the first above-described criterion: the weighting factor $\beta_i$ applied for compensating the approximations was the same at each iteration, and was equal to 2.0 for the scheme MCS1 and to 2.6 for the scheme MCS2.

Figure 10:
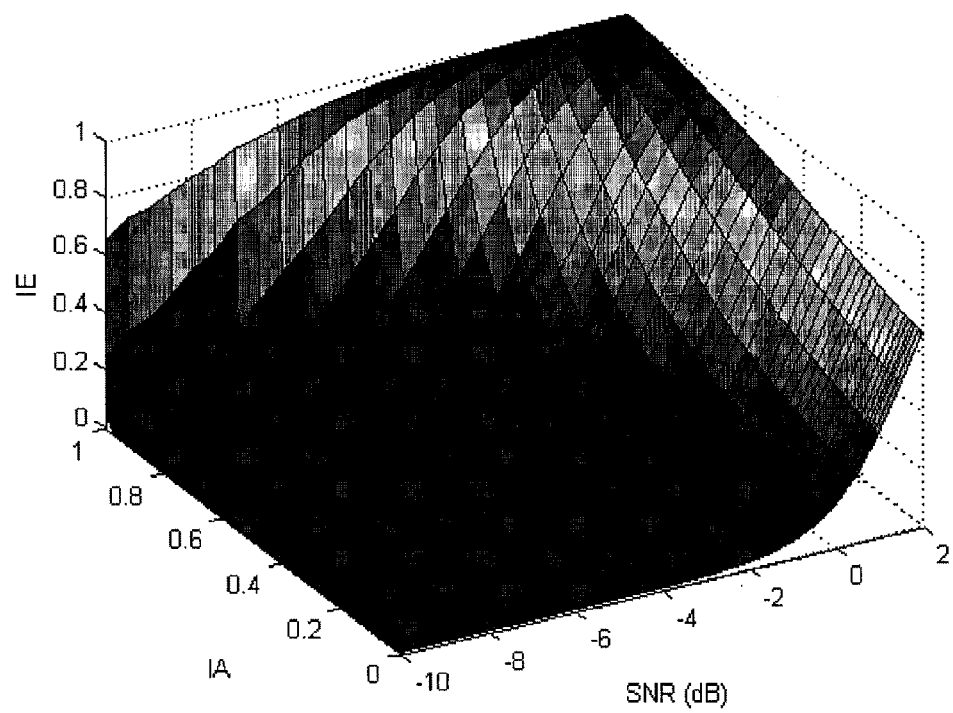
FIGS. 10 and 11 show three-dimensional correspondence tables that can be used during the prediction method of the invention.
Figure 11:
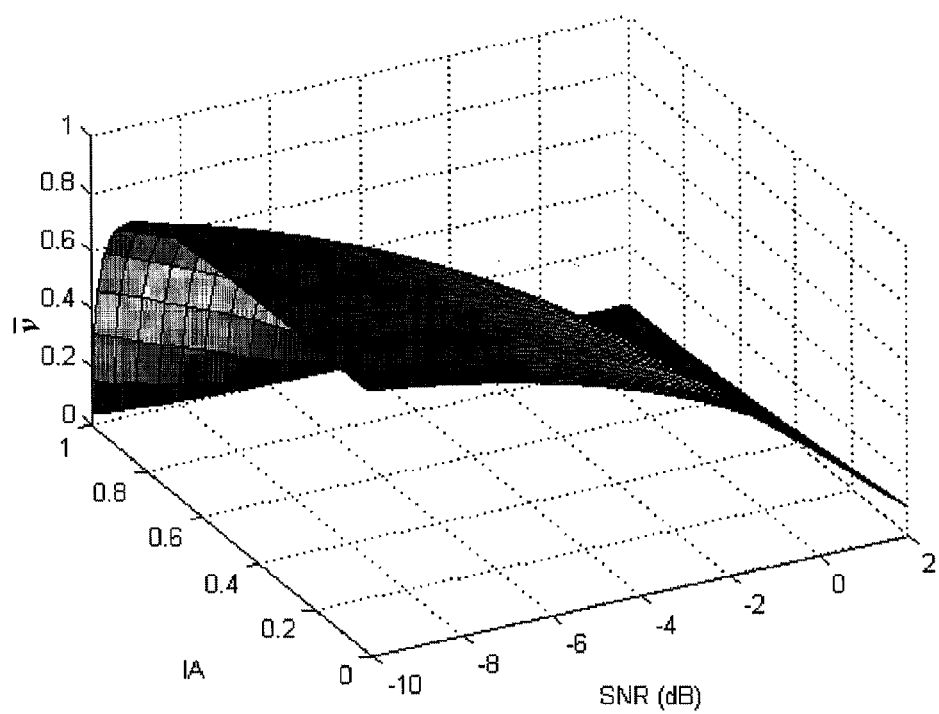

FIGS. 10 and 11 show examples of three-dimensional correspondence tables (i.e. LUT 3D), LUT3, and LU4 stored in the nonvolatile memory of the predictor device of the invention for the scheme MCS1.

For the scheme MCS1, FIG. 8 compares the average error probability per block obtained by simulating the communication system 1 (reference "sim") with the error probability per block obtained using the prediction method of the invention (reference "pred"), for the iterations it=1, 3, 5 and 8 of the iterative receiver 3 and for values for the signal-to-noise ratio per information bit lying in the range −5 dB to −1.5 dB.

For the scheme MCS2, FIG. 9 compares the average error probability per block obtained by simulating the communication system 1 (reference "sim") with the error probability per block obtained using the prediction method of the invention (reference "pred"), for the iterations it=1, 3, 5 and 8 of the iterative receiver 3 and for values for the signal-to-noise ratio per information bit lying in the range −2 dB to 4 dB.

For the two modulation and coding schemes MCS1 and MCS2, the performance of the communication system 1 as predicted in accordance with the invention matches the performance obtained by simulation, thereby validating the semi-analytic stochastic modeling proposed for the receiver 3 of the invention. Greater accuracy can be obtained by calibrating for a specific iteration or by using a distribution of weighting factors.

In the presently described implementation, the second determination module 4B considers a single decoding iteration of the turbo-decoder TURBO-DEC before delivering a prediction of the transmission error probability $P_e(i)$, of the variance $\overline{v}_i$, and of the mean mutual information $I_{E,DEC}^{(i)}$ to iteration i. Nevertheless, in a variant, time delay constraints may make it necessary to accelerate the convergence of the iterative receiver 3 by considering a number NDEC of decoding iterations of the turbo-decoder that is greater than 1. Attention is then given to the variation of the mean mutual information associated with the LEXTPRs delivered by the second decoder DEC2 at the last decoding iteration, i.e. at the iteration NDEC.

As mentioned above, the invention also applies when the equalizer LMMSE-IC does not use LAPPRs on the coded bits delivered by the turbo-decoder for evaluating the variance of the coded symbols, but rather uses LEXTPRs. Under such circumstances, assumptions A1 to A6 are true for a space-time interleaver size $n_c$ that is large enough. Correction by means of the weighting factor $\beta$ is then less important or even pointless.

Furthermore, the presently described implementation is limited to single-user point-to-point transmission.

In a variant, the invention also applies to multi-user detection.

It should also be observed that this prediction method is easily applicable to predicting the performance of transmission systems that are based on modulation and coding schemes that use composite codes other than turbo-codes, and for which iterative sub-optimal decoding has been envisaged, such as for example low density parity check codes LDPC.

Figure 12:
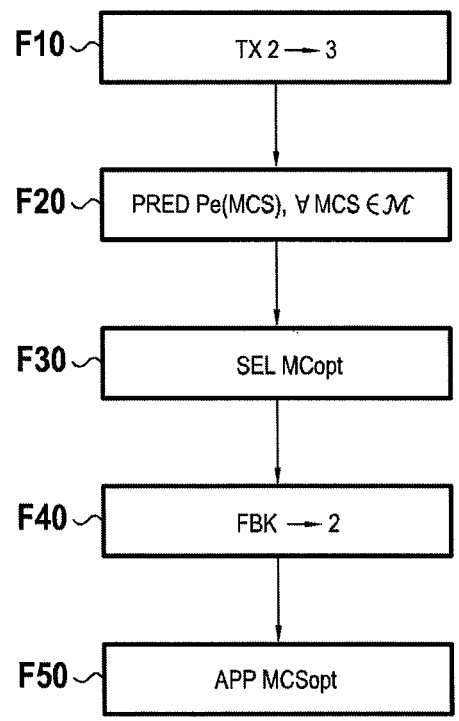
FIG. 12 shows a method of adapting the radio link between the transmitter and receiver of FIG. 2 using a prediction method of the invention.

There follows a brief description, with reference to FIG. 12, of an example of using the prediction method of the invention.

In this example, the transmitter 2 performs a radio link adaptation technique by selecting, as a function of the quality of the radio link connecting it to the receiver 3 (i.e. the transmission channel), a modulation and coding scheme that is adapted to the radio link from a set $\mathcal{M}$ of predetermined STBICMs written MCS1, MCS2, . . . , MCSN that are based on turbo-codes.

It is assumed that a feedback path is provided by the network NW between the receiver 3 and the transmitter 2.

On each transmission from the transmitter 2 to the receiver 3 (step F10), the receiver determines, on the basis of an estimate of the transmission channel and by applying a prediction method of the invention as described above, the error probability to be expected after NSIC iterations of the iterative receiver 3 for each MCS of the set $\mathcal{M}$ (step F20).

Then, from the set $\mathcal{M}$, it selects the MCS, written MCSopt, that maximizes the data rate of the communication system while satisfying a quality of service criterion (in general when a retransmission protocol exists, a block error rate (or error probability) that is less than 10%) (step F30).

The index of the selected MCS is then sent to the transmitter 2 by the receiver 3 over the feedback path (step F40).

The transmitter 2 then applies the MCS as selected by the receiver 3 during its transmissions to the receiver 3 until it receives a new MCS index (step F50).

It should be observed that other applications of the prediction method of the invention may be envisaged.

Thus, by way of example, the method may be used to predict the convergence threshold of iterative receiver is of the LMMSE-IC type based on LAPPRs or on LEXTPRs, or else the number of iterations needed to achieve a given quality of service for a fixed MCS.

APPENDIX 1

Generating correspondence tables

Input data: MCS scheme, $n_t$, $n_{cu}$
$\phi^{-1}(I_{A,dec}) = 4\psi_2^{-1}(I_{A,dec})$ where $\psi_2(\gamma)$ is the mutual information of an AWGN channel with binary inputs (i.e. binary phase shift keying (BPSK)) that are i.i.d and uniformly distributed, and for which the signal-to-noise ratio is $\gamma$.
For a signal to interference plus noise ratio $\gamma = \gamma_{min}$ up to $\gamma_{max}$
{
  For an a priori mutual information $I_{A,DEC} = 0$ up to 1
  {
    $\sigma_A^2 = \phi^{-1}(I_{A,DEC})$;
    $m_A = \sigma_A^2/2$

APPENDIX 1-continued

Generating correspondence tables

For a block bk = 1 up to $n_{bk}$
{
  Generating a pseudorandom interleaver ST-Π;
  Generating an information bit vector u and then the corresponding matrix S as a function of the MCS scheme (u → c → D → S depending on the characteristics of the transmitter 2);
  Creating $\tilde{S}$ in application of $\tilde{s}_{t,l}$: $N_C(s_l, 1/\gamma)$;
  Simulating demodulation: calculating $\{\Lambda_{E,DEM}(d_{t,l,j})\}$ in accordance with (19) with $\tilde{s}_{t,l} = \hat{s}_{t,l}$, $g_t = 1$, and $\zeta_t = 1/\gamma$
  Simulating the deinterleaving in application of ST-Π$^{-1}$: $\Lambda_{E,DEM} \to \Lambda_{I,DEC}$
  Generating $\{\Lambda_{A,DEC}(u_n)\}$ with $\Lambda_{A,DEC}(u_n)$ selected randomly in application of $N((2u_n - 1)m_A, \sigma_A^2)$
  Simulating a turbo decoding iteration resulting in evaluating $\{\Lambda_{D,DEC}(c_n)\}$ and $\{\Lambda_{E,DEC}(u_n)\}$ from the observations $\{\Lambda_{I,DEC}(c_n)\}$ and from the a prioris $\{\Lambda_{A,DEC}(u_n)\}$
  Verifying the success of the decoding
  Updating the histograms $H_{\Lambda_E|0}$ and $H_{\Lambda_E|1}$ of $\{\Lambda_{E,DEC}(u_n)\}$
  These histograms serve to estimate the probability density of the extrinsic LLRs on the systematic bits output from the RSC2 conditional to the actually-transmitted bits, i.e. $p(\Lambda_{E,DEC}(u_n)|1) = p_{\Lambda_E|0}$ and $p(\Lambda_{E,DEC}(u_n)|0) = p_{\Lambda_E|1}$
  Simulating the interleaving in application of ST-Π: $\Lambda_{D,DEC} \to \Lambda_{D,LE}$
  Calculating the variance $\{v_{t,l}\}$ by using $\{\{\Lambda_{D,LE}\}s_{t,l}\}$ and $\bar{v}_{(bk)} = \dfrac{1}{n_t n_{cu}} \displaystyle\sum_{t=1}^{n_t} \sum_{l=1}^{n_{cu}} v_{t,l}$, with $v_{t,l} = \Sigma_{s \in C} P(s|\{\Lambda_{D,LE}\}s_{t,l})|s - m_{t,l}|^2$ (and $m_{t,l} = \Sigma_{s \in C} P(s|\{\Lambda_{D,LE}\}s_{t,l})s$, $P(s|\{\Lambda_{D,LE}\}s_{t,l})$ being evaluated in application of equation (5)
}
Calculating $P_e$,
$\bar{v} = \dfrac{1}{n_{bk}} \displaystyle\sum_{bk=1}^{n_{bk}} \bar{v}_{(bk)}$ Calculating $I_{E,DEC}$ by using the probability densities $p_{\Lambda_E|0}$ and $p_{\Lambda_E|1}$ derived from the histograms $H_{\Lambda_E|0}$ and $H_{\Lambda_E|1}$, as described for example in the document by S. Ten Brink, entitled "Convergence Behavior of Iteratively Decoded Parallel Concatenated Codes", IEEE Transactions on Communications, vol. 49 no 10, pages 1727-1737, October 2001.
}
Store:
in the correspondence table LUT: $P_e$ in association with $\gamma$ and $I_{A,DEC}$ ( i.e. $P_e = F_{JDD_{MCS}}(\gamma, I_{A,DEC})$ )
in the correspondence table LUT3: $\bar{v}$ in association with $\gamma$ and $I_{A,DEC}$ (i.e. $\bar{v} = G_{JDD_{MCS}}(\gamma, I_{A,DEC})$; and
in the correspondence table LUT4: $I_{E,DEC}$ in association with $\gamma$ and $I_{A,DEC}$ ( i.e. $I_{E,DEC} = T_{JDD_{MCS}}(\gamma, I_{A,DEC})$ )
}

Appendix 2

Simulating the performance of the transmission system 1
Input data for the simulation: Y, $\mathcal{H}$, $\sigma_w^2$
Initialization: $\{\Lambda_{D,LE}^{(1)}(d_{b,t,l,j})\}$ and $\{\Lambda_{A,DEC}^{(0)}(u_n)\}$ to 0
For an iteration i = 1 up to NSIC
{
  Reconstruction of the interference:
  Calculate the means $\{m_{b,t,l}^{(i)}\}$ and the variances $\{v_{b,t,l}^{(i)}\}$ by using $\{\Lambda_{D,LE}^{(1)}(d_{b,t,l,j})\}$
  Deducing $\bar{v}^{(i)}$ from equation (18) and
  $\underline{V}^{(i)} = \tilde{v}^{(i)} I_{(L_SW+ n_t)n_t}$
  For b = 1 up to $n_b$
  {
    Calculate $[HbV(i)Hb\dagger + \sigma_w^2 I_{L_{S^{n_r}}}]^{-1}$
    For t = 1 to $n_t$
    {
      Cancel interference: calculate $\{\underline{y}_{b,t,l}\}$ -continued Appendix 2

```
using equation (6)
        Wiener filtering: Calculate f_{b,t} using
equation (11) and {Ŝ_{b;t,l}^{(i)}} using (13)
        Demodulation: Calculate {Λ_{E,DEM}^{(i)}(d_{b;t;l;j})}
using equation (19)
        }
    }
    Deinterleaving by means of ST-Π^{-1}: {Λ_{E,DEM}^{(i)}} → {Λ_{I,DEC}^{(i)}}
    Turbo decoding (only one iteration): Calculate
{Λ_{D,DEC}^{(i)}(c_n)} and {Λ_{E,DEC}^{(i)}(u_n)} from {Λ_{I,DEC}^{(i)}(c_n)} and {Λ_{A,DEC}^{(i-1)}(u_n)}
    Update the error probability P̄_e^{(i)}
    Interleaving by means of ST-Π: {Λ_{D,DEC}^{(i)}} → {Λ_{D,LE}^{(i)}}
    Interleaving the turbo-decoder: {Λ_{E,DEC}^{(i)}} → {Λ_{A,DEC}^{(i)}}
}
```

The invention claimed is:

1. A method of predicting the performance of a communication system on a Multiple Input Multiple Output (MIMO) transmission channel, wherein the system comprises:
a transmitter suitable for applying bit interleaved coded modulation to information bits supplied by a source so as to generate coded symbols, these coded symbols being transmitted by the transmitter over the transmission channel, the coded modulation being based on a turbo-code comprising at least two constituent codes and adapted to encode the information bits in coded bits; and
wherein the system further comprises an iterative receiver, suitable for performing an iterative interference cancellation technique in order to process the coded symbols received from the transmission channel, the iterative receiver comprising an equalizer, which estimates the coded symbols transmitted by the transmitter over the transmission channel said equalizer having an input and an output, a demodulator, which provides an estimation of the coded bits generated by the turbo-code, and a turbo-decoder which decodes the coded bits generated by the turbo-code said turbo-decoder having an input and an output wherein the equalizer, the demodulator and the turbo-decoder are activated during each iteration performed by the iterative receiver, the turbo-decoder comprising at least two decoders suitable for decoding the respective constituent codes of the turbo-code, the decoders being suitable for interchanging probabilistic quantities in an iterative manner wherein, during each iteration performed by the iterative receiver, the equalizer uses probabilistic quantities on the coded bits provided at a preceding iteration by the turbo decoder, the demodulator uses the estimation of the coded symbols provided by the equalizer and the turbo decoder uses the output of the demodulator and probabilistic quantities representative of a priori probabilities on the information bits to decode the coded bits and provides probabilistic quantities on the coded bits used at a subsequent iteration by the equalizer;
the prediction method comprising, for each iteration i of the iterative receiver:
a first determination process of determining a value $\bar{\gamma}_{Eq}^{(i)}$ representative of a signal to interference plus noise ratio at the output from the equalizer from an estimate of the transmission channel and from an estimate $\bar{v}$ of a variance of the coded symbols at the input to the equalizer at iteration i, this determination being performed by using a preestablished function characterizing the behavior of the equalizer; and
a second determination process of determining:
a transmission error probability $P_e(i)$ on the channel;
a variance $\bar{v}_i$ of the coded symbols wherein the variance $\bar{v}_i$ is determined at the output from the turbo-decoder; and
mean mutual information $I_{E,DEC}^{(i)}$ between the information bits supplied by the source and probabilistic quantities representative of extrinsic probabilities on those information bits supplied at the output from the turbo-decoder;
the second determination process being done from the value $\bar{\gamma}_{Eq}^{(i)}$ and from "a priori" mean mutual information $I_{A,DEC}^{(i)}$ between the information bits supplied by the source and probabilistic quantities representative of a priori probabilities on these information bits available at the input of the turbo-decoder at iteration i, by using preestablished functions characterizing the behavior of the demodulator and of the turbo-decoder for a predetermined number (NDEC) of decoding iterations performed by the turbo-decoder;
the variance $\bar{v}_i$ being used during the first determination process of the following iteration i+1 of the iterative receiver to estimate the variance $\bar{v}$ of the coded symbols at the input of the equalizer, and the mean mutual information $I_{E,DEC}^{(i)}$ being used during the second determination process of iteration i+1 as a priori mean mutual information $I_{A,DEC}^{(i+1)}$; wherein the result of the second determination process after a given number of iterations of the iterative receiver is used to select a coded modulation scheme based on a turbo-code to be applied by the communication system to satisfy a given quality of service criterion.

2. A method according to claim 1, wherein a function used for determining the variance $\bar{v}_i$ is preestablished by assuming that the variance of the coded symbols at the output from the turbo-decoder is estimated by the iterative receiver from probabilistic quantities representative of a posteriori probabilities supplied by the turbo-decoder on the coded bits.

3. A method according to claim 1, wherein a function used for determining the variance $\bar{v}_i$ is preestablished by assuming that the variance of the coded symbols at the output from the turbo-decoder is estimated by the iterative receiver from probabilistic quantities representative of extrinsic probabilities supplied by the turbo-decoder on the coded bits.

4. A method according to claim 1, wherein:
the Multiple Input Multiple Output (MIMO) transmission channel is a block fading channel having $n_b$ blocks;
the transmitter of the communication system transmits the coded symbols over $n_t$ transmit antennas; and
the equalizer of the iterative receiver is a Linear Minimum Mean-Square Error Successive Iterative Cancellation (LMMSE-SIC) equalizer; and
wherein the first determination process comprises:
an estimation process of estimating a signal to interference plus noise ratio $\gamma_{b;t}^{(i)}$ at the output from the equalizer for each block b of the fading channel and for each transmit antenna t of the transmitter;
an estimation process for each signal to interference plus noise ratio $\gamma_{b;t}^{(i)}$ of estimating a mean mutual information $I_{LE_{b;t}}^{(i)}$ of an additive white Gaussian noise channel with variance $1/\gamma_{b;t}^{(i)}$, by using a preestablished invertible function $\psi$;
the value $\bar{\gamma}_{Eq}^{(i)}$ being determined using the following equation:

$$\bar{\gamma}_{Eq}^{(i)} = \psi^{-1}\left(\frac{1}{n_b n_t}\sum_{b=1}^{n_b}\sum_{t=1}^{n_t} I_{LE_{b,t}}^{(i)}\right).$$

5. A method according to claim 1, wherein:
the preestablished function characterizing the behavior of the equalizer is stored in the form of a two-dimensional correspondence table;
the preestablished functions characterizing the behavior of the demodulator and of the decoders of the turbo-decoder are stored in the form of three-dimensional correspondence tables.

6. A method according to claim 2, wherein the variance of the coded symbols at the input of the equalizer at iteration i+1 is estimated using:

$$\bar{v} = \min(\beta \bar{v}^{(i)}, 1)$$

where β designates a weighting factor.

7. A method according to claim 6, wherein the weighting factor β is selected so as to minimize a sum, over all of the iterations performed by the iterative receiver and over a number K of realisations of the transmission channel, of distances evaluated between the error probability estimated during the second determination process and an error probability obtained by simulating the performance of the transmission system for said iterations performed by the iterative receiver and for said number K of transmission channel realisations.

8. A method according to claim 6, wherein the weighting factor β is selected so as to minimize, for a determined iteration of the iterative receiver, a sum over a number K of realisations of the transmission channel of distances evaluated between the error probability estimated during the second determination process and an error probability obtained by simulating the performance of the transmission system for said number K of transmission channel realisations and for that determined iteration.

9. A method according to claim 1, wherein the error probability $P_e(i)$, the variance $\bar{v}_i$, and the mutual information $I_{E,DEC}^{(i)}$ are determined after a decoding iteration of the turbo-decoder.

10. A method according to claim 1, wherein the error probability $P_e(i)$, the variance $\bar{v}_i$, and the mutual information $I_{E,DEC}^{(i)}$ are determined after a plurality of decoding iterations of the turbo-decoder.

11. A method according to claim 1, wherein the bit interleaved coded modulation is based on Gray labeling.

12. A computer comprising a processor and a memory, said computer having stored thereon a program including instructions for executing the prediction method according to claim 1, when said program is executed by said computer.

13. A non-transitory computer-readable data medium having stored thereon a computer program including instructions for performing the prediction method according to claim 1 when said instructions are executed by a processor.

14. A method of adapting a radio link over a transmission channel, said method being implemented by a communication system having a transmitter, the transmitter suitable for applying bit interleaved coded modulation to information bits supplied by a source so as to generate coded symbols, these coded symbols being transmitted by the transmitter over the transmission channel, the coded modulation being based on a turbo-code comprising at least two constituent codes and adapted to encode the information bits in coded bits, and an iterative receiver, the iterative receiver comprising an equalizer which estimates the coded symbols transmitted by the transmitter over the transmission channel said equalizer having an input and an output, a demodulator which provides an estimation of the coded bits generated by the turbo-code, and a turbo-decoder which decodes the coded bits generated by the turbo-code said turbo-decoder having an input and an output wherein the equalizer, the demodulator and the turbo-decoder are activated during each iteration performed by the iterative receiver, the turbo-decoder comprising at least two decoders suitable for decoding the respective constituent codes of the turbo-code, the decoders being suitable for interchanging probabilistic quantities in an iterative manner which decodes the coded bits generated by the turbo-code said turbo-decoder having an input and an output wherein the equalizer, the demodulator and the turbo-decoder, the adaptation method comprising:
selecting a bit interleaved coded modulation based on a turbo-code from a predetermined set of coding and modulation schemes available to the transmitter as a function of a transmission error probability $P_e(i0)$ determined by a prediction method for the selected bit interleaved coded modulation at a predetermined iteration i0 of the iterative receiver, said prediction method comprising for each iteration i of the iterative receiver:
a first determination process of determining a value $\bar{\gamma}_{Eq}^{(i)}$ representative of a signal to interference plus noise ratio at the output from the equalizer from an estimate of the transmission channel and from an estimate $\bar{v}$ of a variance of the coded symbols at the input to the equalizer at iteration i, this determination being performed by using a preestablished function characterizing the behavior of the equalizer; and
a second determination process of determining:
a transmission error probability $P_e(i)$ on the channel at iteration i;
a variance $\bar{v}_i$ of the coded symbols wherein the variance $\bar{v}_i$, is determined at the output from the turbo-decoder; and
mean mutual information $I_{E,DEC}^{(i)}$ between the information bits supplied by the source and probabilistic quantities representative of extrinsic probabilities on those information bits supplied at the output from the turbo-decoder;
the second determination process being done from the value $\bar{\gamma}_{Eq}^{(i)}$ and from "a priori" mean mutual $I_{A,DEC}^{(i)}$ between the information bits supplied by the source and probabilistic quantities representative of a priori probabilities on these information bits available at the input of the turbo-decoder at iteration i, by using preestablished functions characterizing the behavior of the demodulator and of the turbo-decoder for a predetermined number (NDEC) of decoding iterations performed by the turbo-decoder;
the variance $\bar{v}_i$ being used during the first determination process of the following iteration i+1 of the iterative receiver to estimate the variance $\bar{v}$ of the coded symbols at the input of the equalizer, and the mean mutual information $I_{A,DEC}^{(i+1)}$ being used during the second determination process of iteration i+1 as a priori mean mutual information $I_{A,DEC}^{(i+1)}$.

15. A device for predicting the performance of a communication system on a transmission channel having multiple inputs and multiple outputs (MIMO), the system comprising:
a transmitter suitable for applying bit interleaved coded modulation to information bits supplied by a source so as to generate coded symbols, these coded symbols being transmitted by the transmitter over the transmission channel, the coded modulation being based on a turbo-code comprising at least two constituent codes and adapted to encode the information bits in coded bits; and an iterative receiver, suitable for performing an iterative interference cancellation technique in order to process the coded symbols received from the transmission channel, the iterative receiver comprising an equalizer which estimates the coded symbols transmitted by the transmitter over the transmission channel said equalizer having an input and an output, a demodulator which provides an estimation of the coded bits generated by the turbo-code, and a turbo-decoder which decodes the coded bits generated by the turbo-code said turbo-decoder having an input and an output wherein the equalizer, the demodulator and the turbo-decoder are activated during each iteration performed by the iterative receiver, the turbo-decoder comprising at least two decoders suitable for decoding the respective constituent codes of the turbo-code, the decoders being suitable for interchanging probabilistic quantities in an iterative manner wherein, during each iteration performed by the iterative receiver, the equalizer uses probabilistic quantities on the coded bits provided at a preceding iteration by the turbo decoder, the demodulator uses the estimation of the coded symbols provided by the equalizer and the turbo decoder uses the output of the demodulator and probabilistic quantities representative of a priori probabilities on the information bits to decode the coded bits and provides probabilistic quantities on the coded bits used at a subsequent iteration by the equalizer;

the device comprising a processor suitable, on each iteration i of the iterative receiver, for performing:

a first determination process suitable for determining a value $\bar{\gamma}_{Eq}^{(i)}$ representative of a signal to interference plus noise ratio at the output from the equalizer from an estimate of the transmission channel and from an estimate $\bar{v}$ of a variance of the coded symbols at the input to the equalizer at iteration i, this determination being performed by using a preestablished function characterizing the behavior of the equalizer; and a second determination process, suitable for determining:
 a transmission error probability $P_e(i)$ on the channel;
 a variance $\bar{v}_i$ of the coded symbols wherein the variance $\bar{v}_i$ is determined at the output from the turbo-decoder; and
 mean mutual information $I_{E,DEC}^{(i)}$ between the information bits supplied by the source and probabilistic quantities representative of extrinsic probabilities on those information bits supplied at the output from the turbo-decoder;

the second determination process being done from the value $\bar{\gamma}_{Eq}^{(i)}$ and from "a priori" mean mutual information $I_{A,DEC}^{(i)}$ between the information bits supplied by the source and probabilistic quantities representative of a priori probabilities on these information bits available at the input of the turbo-decoder at iteration i, the second determination process using preestablished functions characterizing the behavior of the demodulator and of each decoder of the turbo-decoder;

the variance $\bar{v}_i$ being used by the first modeling determination process at the following iteration i+1 of the iterative receiver to estimate the variance $\bar{v}$ of the coded symbols at the input of the equalizer, and the mean mutual information $I_{E,DEC}^{(i)}$ being used by the second determination process at iteration i+1 as a priori mean mutual information $I_{A,DEC}^{(i+1)}$;

wherein the result of the second determination process after a given number of iterations of the iterative receiver is used to select a coded modulation scheme based on a turbo-code to be applied by the communication system to satisfy a given quality of service criterion.

16. A communication system comprising:

a transmitter suitable for applying bit interleaved coded modulation to information bits supplied by a source so as to generate coded symbols, these coded symbols being transmitted by the transmitter over a transmission channel, the coded modulation being based on a turbo-code comprising at least two constituent codes and adapted to encode the information bits in coded bits; and an iterative receiver, suitable for performing an iterative interference cancellation technique in order to process the coded symbols received from the transmission channel, the iterative receiver comprising an equalizer which estimates the coded symbols transmitted by the transmitter over the transmission channel said equalizer having an input and an output, a demodulator which provides an estimation of the coded bits generated by the turbo-code, and a turbo-decoder which decodes the coded bits generated by the turbo-code said turbo-decoder having an input and an output wherein the equalizer, the demodulator and the turbo-decoder are activated during each iteration performed by the iterative receiver, the turbo-decoder comprising at least two decoders suitable for decoding the respective constituent codes of the turbo-code, the decoders being suitable for interchanging probabilistic quantities in an iterative manner wherein, during each iteration performed by the iterative receiver, the equalizer uses probabilistic quantities on the coded bits provided at a preceding iteration by the turbo decoder, the demodulator uses the estimation of the coded symbols provided by the equalizer and the turbo decoder uses the output of the demodulator and probabilistic quantities representative of a priori probabilities on the information bits to decode the coded bits and provides probabilistic quantities on the coded bits used at a subsequent iteration by the equalizer;

the receiver also comprising a predictor device comprising a processor suitable, on each iteration i of the iterative receiver, for performing:

a first modeling determination process suitable for determining a value $\bar{\gamma}_{Eq}^{(i)}$ representative of a signal to interference plus noise ratio at the output from the equalizer from an estimate of the transmission channel and from an estimate $\bar{v}$ of a variance of the coded symbols at the input to the equalizer at iteration i, this determination being performed by using a preestablished function characterizing the behavior of the equalizer; and a second determination process, suitable for determining:
 a transmission error probability $P_e(i)$ on the channel;
 a variance $\bar{v}_i$ of the coded symbols wherein the variance $\bar{v}_i$, is determined at the output from the turbo-decoder; and
 mean mutual information $I_{E,DEC}^{(i)}$ between the information bits supplied by the source and probabilistic quantities representative of extrinsic probabilities on those information bits supplied at the output from the turbo-decoder;

the second determination being done from the value $\bar{\gamma}_{Eq}^{(i)}$ and from "a priori" mean mutual information $I_{A,DEC}^{(i)}$ between the information bits supplied by the source and probabilistic quantities representative of a priori probabilities on these information bits available at the input of the turbo-decoder at iteration i, the second determination process using preestablished functions characterizing the behavior of the demodulator and of each decoder of the turbo-decoder;

the variance $\bar{v}_i$ being used by the first determination process at the following iteration i+1 of the iterative receiver to estimate the variance $\bar{v}$ of the coded symbols at the input of the equalizer, and the mean mutual information $I_{E,DEC}^{(i)}$ being used by the second determination process at iteration i+1 as a priori mean mutual information $I_{A,DEC}^{(i+1)}$;

wherein the result of the second determination process after a given number of iterations of the iterative receiver is used to select a coded modulation scheme based on a turbo-code to be applied by the communication system to satisfy a given quality of service criterion.

* * * * *